(12) United States Patent
Burberry et al.

(10) Patent No.: US 8,618,003 B2
(45) Date of Patent: Dec. 31, 2013

(54) METHOD OF MAKING ELECTRONIC DEVICES USING SELECTIVE DEPOSITION

(75) Inventors: Mitchell S. Burberry, Webster, NY (US); David H. Levy, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/310,831

(22) Filed: Dec. 5, 2011

(65) Prior Publication Data

US 2013/0140064 A1    Jun. 6, 2013

(51) Int. Cl.
*H01L 21/469*    (2006.01)
*H01L 21/31*    (2006.01)

(52) U.S. Cl.
USPC ........... 438/765; 438/680; 438/762; 438/763; 438/758; 438/778; 257/E21.269; 257/E21.487; 257/E21.17; 257/E21.171

(58) Field of Classification Search
None
See application file for complete search history.

(56) References Cited

U.S. PATENT DOCUMENTS

| | | |
|---|---|---|
| 5,605,780 A | 2/1997 | Burberry et al. |
| 5,858,607 A | 1/1999 | Burberry et al. |
| 6,551,757 B1 | 4/2003 | Bailey et al. |
| 6,924,080 B2 | 8/2005 | Mulligan et al. |
| 7,160,819 B2 | 1/2007 | Conley, Jr. et al. |
| 7,846,644 B2 | 12/2010 | Irving et al. |
| 7,998,878 B2 | 8/2011 | Levy et al. |
| 8,017,183 B2 | 9/2011 | Yang et al. |
| 2005/0084610 A1 | 4/2005 | Selitser |
| 2007/0077349 A1* | 4/2007 | Newman et al. ............. 427/66 |
| 2009/0051740 A1 | 2/2009 | Hiroshima |
| 2009/0081827 A1 | 3/2009 | Yang et al. |
| 2011/0120542 A1 | 5/2011 | Levy |
| 2011/0120543 A1 | 5/2011 | Levy |
| 2011/0120544 A1 | 5/2011 | Levy et al. |
| 2011/0120752 A1 | 5/2011 | Imai et al. |
| 2011/0120757 A1 | 5/2011 | Levy |
| 2011/0121283 A1 | 5/2011 | Levy |
| 2011/0122552 A1 | 5/2011 | Levy et al. |

OTHER PUBLICATIONS

Ashwini Sinha, et al., "Area selective atomic layer deposition of titanium dioxide: Effect of precursor chemistry," J. Vac. Sci. Technol. B 24(6), Nov./Dec. 2006, American Vacuum Society, pp. 2523-2532.

* cited by examiner

*Primary Examiner* — Seahvosh Nikmanesh
(74) *Attorney, Agent, or Firm* — J. Lanny Tucker

(57) ABSTRACT

Electronic devices can be prepared by forming a patterned thin film on a suitable receiver substrate. A cyanoacrylate polymer is used as a deposition inhibitor material and applied first as a deposition inhibitor material. The deposition inhibitor material can be patterned to provide selected areas on the receiver substrate where the deposition inhibitor is absent. An inorganic thin film is then deposited on the receiver substrate using a chemical vapor deposition technique only in those areas where the deposition inhibitor material is absent. The cyanoacrylate polymer deposition inhibitor material can be applied by thermal transfer from a donor element to a receiver substrate before a patterned thin film is formed.

20 Claims, 14 Drawing Sheets

METHOD OF MAKING ELECTRONIC DEVICES USING SELECTIVE DEPOSITION

FIELD OF THE INVENTION

This invention relates to a method of selective deposition of materials onto a substrate in order to prepare electronic devices. The deposited materials include a deposition inhibitor material that is a particular cyanoacrylate polymer. This invention is also directed to devices prepared using this method.

BACKGROUND OF THE INVENTION

Modern-day electronics require multiple patterned layers of electrically or optically active materials, sometimes over a relatively large substrate. Electronics such radio frequency identification (RFID) tags, photovoltaics, and optical and chemical sensors all require some level of patterning in their electronic circuitry. Flat panel displays, such as liquid crystal displays or electroluminescent displays rely upon accurately patterned sequential layers to form thin film components of the backplane. These components include capacitors, transistors, and power buses. The industry is continually looking for new methods of materials deposition and layer patterning for both performance gains and cost reductions.

Thin film transistors (TFT's) can be viewed as representative of the electronic and manufacturing issues for many thin film components. TFT's are widely used as switching elements in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. For applications in which a transistor needs to be applied to a substrate, a thin film transistor is typically used. A critical step in fabricating the thin film transistor involves the deposition of a semiconductor onto the substrate. Presently, most thin film devices are made using vacuum deposited amorphous silicon as the semiconductor, which is patterned using traditional photolithographic methods. Amorphous silicon as a semiconductor for use in TFTs still has its drawbacks. Thus, there has been active work to find a suitable replacement.

There is a growing interest in depositing thin film semiconductors on plastic or flexible substrates, particularly because these supports would be more mechanically robust, lighter weight, and allow more economic manufacturing, for example, by allowing roll-to-roll processing. A useful example of a flexible substrate is polyethylene terephthalate. Such plastics, however, limit device processing to below 200° C.

In spite of the potential advantages of flexible substrates, there are many problems associated with plastic supports when using traditional photolithography during conventional manufacturing, making it difficult to perform alignments of transistor components across typical substrate widths up to one meter or more. Traditional photolithographic processes and equipment can be seriously impacted by the substrate's maximum process temperature, solvent resistance, dimensional stability, water, and solvent swelling, all key parameters in which plastic supports are typically inferior to glass.

There is interest in utilizing lower cost processes for deposition that do not involve the expense associated with vacuum processing and patterning with photolithography. In typical vacuum processing, a large metal chamber and sophisticated vacuum pumping systems are required in order to provide the necessary environment. In typical photolithographic systems, much of the material deposited in the vacuum chamber is removed. The deposition and photolithography items have high capital costs and preclude the easy use of continuous web based systems.

In the past decade, various materials have received attention as a potential alternative to amorphous silicon for use in semiconductor channels of thin film transistors. The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below. Additionally, metal oxide dielectrics such as alumina ($Al_2O_3$) and $TiO_2$ are useful in practical electronics applications as well as optical applications such as interference filters.

In addition, metal oxide materials can serve as barrier or encapsulation elements in various electronic devices. These materials also require patterning so that a connection can be made to the encapsulated devices.

Although successful thin films in electronic devices have been made with sputtering techniques, it is clear that very precise control over the reactive gas composition (such as oxygen content) is required to produce good quality devices. Chemical vapor deposition (CVD) techniques, in which one or more reactive gasses decompose or react to form the desired film material at a surface, can be useful routes to achieving high quality film growth. Atomic layer deposition ("ALD") is yet an alternative film deposition technology that can provide improved thickness resolution and conformal capabilities, compared to its CVD predecessor. The ALD process segments the conventional thin-film deposition process of conventional CVD into single atomic-layer deposition steps.

ALD can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors. Examples of useful semiconducting materials are compound semiconductors such as gallium arsenide, gallium nitride, cadmium sulfide, zinc oxide, and zinc sulfide.

Advantageously, ALD steps are self-terminating and can deposit precisely one atomic layer when conducted up to or beyond self-termination exposure times. An atomic layer typically ranges from 0.1 to 0.5 molecular monolayers with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of gas phase nucleation can be tolerated.

In ALD processes, typically two molecular precursors are introduced into the ALD reactor in separate stages. The details of such stages and molecular precursors useful in each are explained in [0016]-[0034] of U.S. Patent Application Publication 2009/0081827 (Yang et al.) that is incorporated herein by reference along with the references mentioned in these paragraphs.

U.S. Patent Application Publication 2005/0084610 (Selitser) discloses an atmospheric pressure atomic layer chemical vapor deposition process that involve separate chambers for each stage of the process and a series of separated injectors are spaced around a rotating circular substrate holder track.

A spatially dependent ALD process can be accomplished with other apparatus or methods described in more detail in WO 2008/082472 (Cok), U.S. Patent Application Publications 2008/0166884 (Nelson et al.), 2008/0166880 (Levy), 2009/0130858 (Levy), 2009/0078204 (Kerr et al.), 2009/0051740 (Baker), 2009/0081366 (Kerr et al.), and U.S. Pat. Nos. 7,413,982 (Levy), 7,456,429 (Levy), and 7,572,686 (Levy et al.), all of which are hereby incorporated by reference in their entirety. These publications describe various attempts to overcome one of the difficult aspects of a spatial ALD system, which is undesired intermixing of the continuously flowing mutually reactive gases.

There is growing interest in combining ALD with a technology known as selective area deposition (or "SAD") in which a material is deposited only in those areas that are desired or selected. Sinha et al. [*J. Vac. Sci. Technol.* B 24 6 2523-2532 (2006)] have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. One approach to combining patterning and depositing the semiconductor is shown in U.S. Pat. No. 7,160,819 (Conley et al) that describes materials for use in patterning zinc oxide on silicon wafers.

A number of materials have been used by researchers as deposition inhibitor materials for selective area deposition. Sinha et al., referenced above, used poly(methyl methacrylate) (PMMA) in their masking layer. Conley et al. employed acetone and deionized water, along with other process contaminants as deposition inhibitor materials.

U.S. Patent Application Publications 2009/0081827 and 2009/0051740 (both noted above) describe the use of crosslinkable organic compounds or polymers, such as organosiloxane polymers, as deposition inhibitor materials, in ALD processes to provide various electronic devices. These crosslinkable materials are generally coated out of organic solvents.

U.S. Published Patent Application 2011/2011/0120757 (Levy) describes the use of a hydrophilic polymer as a deposition inhibitor material. This material is soluble in an aqueous solution comprising 50% water and one or more water-miscible organic solvents. These methods rely on pre-patterning the inhibitor before the atomic layer deposition step and are usually followed by a cleaning step to remove inhibitors before further processing. Various conventional modalities can be used to produce the pre-patterned inhibitor including ink-jet, offset lithography, flexography, screen printing, thermal and laser thermal imaging.

Thermal imaging and laser thermal imaging methods are of interest as these are amenable to high resolution features and dynamic registration control particularly on flexible supports. There exists a need to find deposition inhibitor materials that are particularly advantaged for thermal imaging methods for example methods that use laser thermal imaging.

SUMMARY OF THE INVENTION

The present invention provides a deposition method for forming a patterned thin film comprising:

applying a composition comprising a deposition inhibitor material to a receiver substrate, simultaneously or subsequently to the applying step, patterning the deposition inhibitor material to provide selected areas on the receiver substrate where the deposition inhibitor material is absent, and depositing an inorganic thin film on the receiver substrate by chemical vapor deposition only in those areas where the deposition inhibitor material is absent, wherein the deposition inhibitor material is a polymer comprising recurring units represented by the following Structure (I):

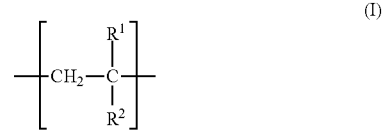

wherein $R^1$ is hydrogen, an alkyl group, or a group as defined for $R^2$, and $R^2$ is a cyano, isocyanate, azide, sulfonyl, nitro, phosphoric, phosphonyl, heteroaryl, or $-C(=X)-R^3$ wherein X is oxygen, sulfur, or $N^+(R)_2$, $R^3$ is R, OR, $OM^+$, $OC(=O)OR$, SR, $NHC(=O)R$, $NHC(=O)N(R)_2$, $N(R)_2$, or $N^+(R)_3$, $M^+$ is an alkali or ammonium cation, and R is hydrogen, a halogen, or an alkyl or cycloalkyl group.

This invention also provides an electronic device prepared using the method of this invention, which electronic device comprises a receiver substrate and a deposited pattern of the cyanoacrylate polymer comprising recurring units represented by Structure (I).

It is advantageous that in some embodiments, the inorganic thin film can be deposited using spatially dependant ALD that comprises:

providing a series of gas channels, each in contact with a discrete separate region of a receiver substrate, and each gas channel having a gas composition, the gas composition comprising, in order, at least a first reactive gaseous material, an inert purge gas, and a second reactive gaseous material, and optionally repeating this sequence a plurality of times, and moving the receiver substrate relative to the gas channels so that a portion of the receiver substrate comes into contact sequentially with at least two gas zones, wherein the first reactive gaseous material is capable of reacting with the receiver substrate surface that has been treated with the second reactive gaseous material to form the inorganic thin film.

Selective deposition of metal oxides and other materials can be used in a chemical vapor deposition process such as ALD system, for example a spatially dependent ALD system. It is a further advantage that the present invention is adaptable for deposition on a moving web or other moving receiver substrate, including deposition onto a large area substrate. It is another that the invention allows operation under atmospheric pressure conditions, for example in low temperature processes at atmospheric pressures in an unsealed environment or open to ambient atmosphere.

It is useful that the present invention provides for the deposition of the deposition inhibitor material directly onto a receiver substrate to be patterned in an imagewise manner using thermal ablation. Alternatively, the deposition inhibitor material can be imagewise transferred from a donor element to a receiver substrate to be patterned by means of thermal transfer.

These advantages are provided by using a unique deposition inhibitor material that has a thermally decomposable backbone, but the backbone can be easily reformed on a surface under ordinary atmospheric conditions.

Other objects, features, and advantages of the present invention will become apparent to those skilled in the art upon a reading of the following detailed description when taken in conjunction with the drawings that show and describe illustrative embodiments of the invention.

DETAILED DESCRIPTION OF THE INVENTION

Definitions

Figure 1:
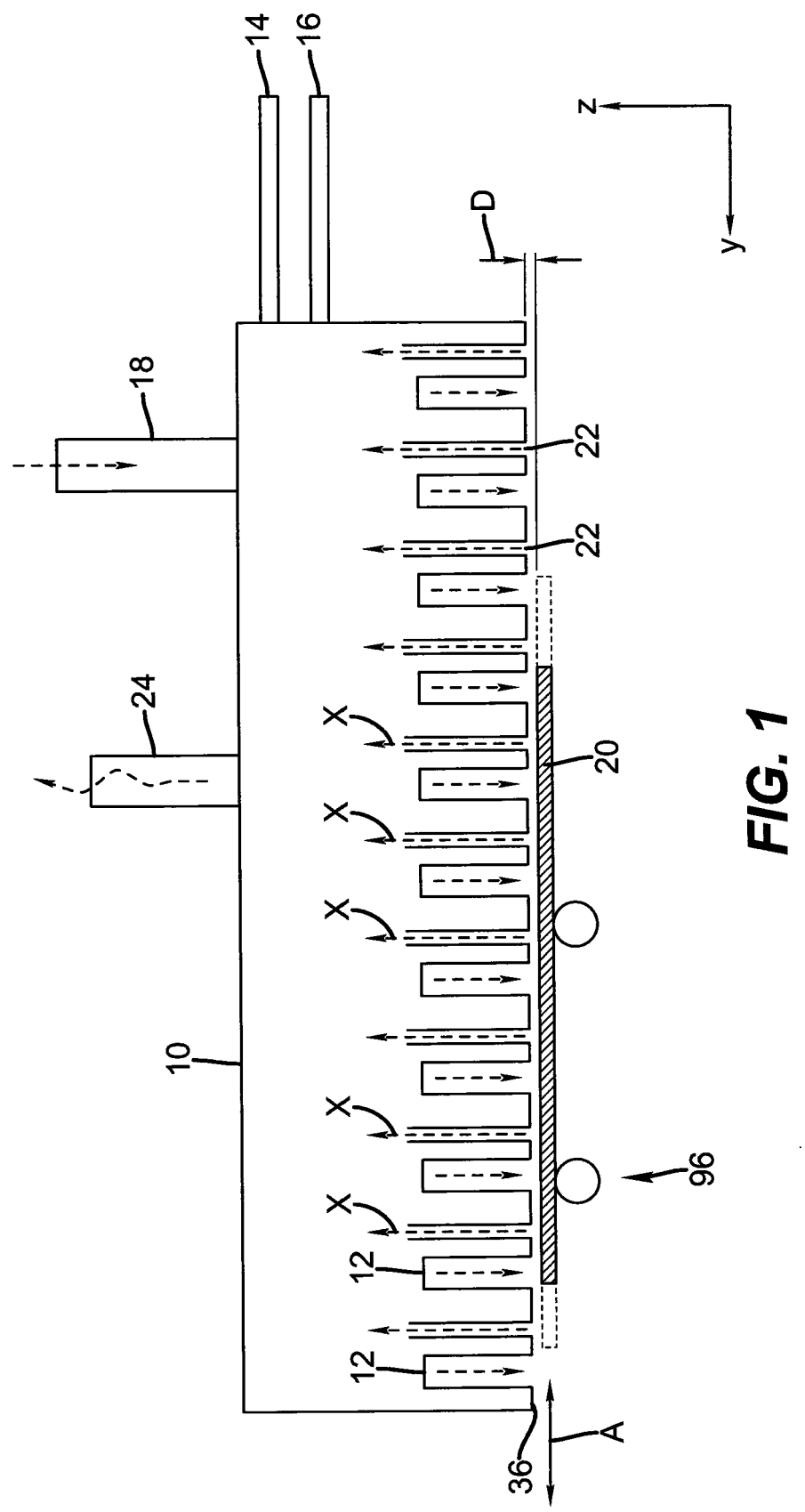
FIG. 1 is a cross-sectional side view of a delivery head for atomic layer deposition for one embodiment of the present invention.

The term "deposition inhibitor material" refers herein to a material applied to a substrate as well as the material resulting from any optionally subsequent crosslinking or other reaction that modifies the material that can occur prior to depositing an inorganic thin film on a receiver substrate using a suitable chemical vapor deposition technique.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art.

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

As used herein to define various chemicals, components, and materials, unless otherwise indicated, the singular forms "a", "an", and "the" are intended to include one or more of the chemicals, components, and materials (that is, including plurality referents).

The FIGS. provided with this application are not drawn to scale but are intended to show overall function and the structural arrangement of some embodiments of the present invention.

Unless otherwise indicated, percentages refer to percents by total dry weight, for example, weight % based on total solids of either a layer or composition. Unless otherwise indicated, the percentages can be the same for either the dry layer or the total solids of a composition used to prepare a layer.

The term "thin" in relation to the patterned film formed in the method of this invention generally refers to a maximum dry thickness less than or equal to 0.5 μm or more typically at least 0.001 μm and up to and including 0.2 μm.

Deposition Inhibitor Materials and Thermal Transfer Layers

Examples of deposition inhibitor materials useful in the present invention are cyanoacrylate polymers as defined using the following Structure (I):

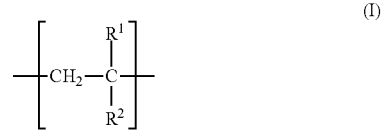

wherein $R^1$ is hydrogen, a substituted or unsubstituted alkyl group, for example having 1 to 20 carbon atoms, or a group as defined for $R^2$ below. For example, $R^1$ can be hydrogen, an unsubstituted alkyl group having 1 to 8 carbon atoms, or a cyano group. In many embodiments, $R^1$ is hydrogen or a cyano group.

$R^2$ is a cyano, isocyanate, azide, sulfonyl, nitro, phosphoric, phosphonyl, heteroaryl, or —C(=X)—$R^3$ group wherein X is oxygen, sulfur, or $N^+(R)_2$, $R^3$ is R, OR, $OM^+$, OC(=O)OR, SR, NHC(=O)R, NHC(=O)N(R)$_2$, N(R)$_2$, or $N^+(R)_3$, $M^+$ is an alkali or ammonium cation, and R is hydrogen, a halogen, or a substituted or unsubstituted alkyl group having 1 to 20 carbon atoms or a substituted or unsubstituted cycloalkyl group having 5 to 10 carbon atoms in the carbocyclic ring. In many embodiments, R is hydrogen, a halogen, a methyl group, or an ethyl group, and more likely, R is hydrogen, a halogen, or methyl.

In many embodiments, $R^2$ is a cyano group, and it is useful wherein at least one of $R^1$ and $R^2$ is a cyano group.

In some embodiments, the deposition inhibitor material is a cyanoacrylate polymer comprising recurring units that are represented by Structure (I) wherein R is hydrogen or an alkyl or cyano group, and at least one of $R^1$ and $R^2$ is a cyano group.

In other embodiments, the deposition inhibitor material is a cyanoacrylate polymer comprising recurring units that are represented by Structure (I) wherein $R^1$ is hydrogen or an alkyl group having 1 to 8 carbon atoms, and $R^2$ is a cyano group. Representative examples of such polymers including but are not limited to, poly(methyl cyanoacrylate), poly(ethyl cyanoacrylate), poly(n-butyl or t-butyl cyanoacrylate), poly(n-octyl cyanoacrylate), and poly(2-octyl cyanoacrylate).

The cyanoacrylate polymer can be a "homopolymer" meaning that all of the recurring units are the same. However, in other embodiments, the cyanoacrylate is a copolymer comprising at least two different recurring units, in random or block order. Such copolymers can comprise at least two different recurring units represented by Structure (I), with or without other recurring units that are not represented by Structure (I). Alternatively, they can be copolymers that comprise two or more different recurring units, in random or block order, and only one type of recurring unit represented by Structure (I). A useful copolymer is poly(methyl cyanoacrylate-co-ethyl cyanoacrylate).

In most embodiments, the cyanoacrylate polymer comprises the same or different recurring units that are represented by Structure (I) in an amount of at least 1 mol % and up to and including 100 mol %, or typically at least 50 mol % and up to and including 100 mol %, based on total polymer recurring units.

The cyanoacrylate polymer used in this invention generally has a number average molecular weight of at least 10,000 and up to and including 1,000,000, as measured by gel permeation chromatography.

Examples of useful cyanoacrylate polymers comprise one or more recurring units that are identified below in TABLE I by $R^1$ and $R^2$ groups:

TABLE I

| Compound | $R^1$ | $R^2$ |
| --- | --- | --- |
| 1 | —CN | —COOCH$_3$ |
| 2 | —CN | —COOC$_2$H$_5$ |
| 3 | —CN | —COOC$_3$H$_7$ |
| 4 | —CN | —COOC$_4$H$_9$ |
| 5 | —CN | —COOH |
| 6 | —CN | —CN |
| 7 | —CN | —COOCH$_2$CH(CH$_2$CH$_3$)C$_4$H$_9$ |
| 8 | —CN | —COOCH$_2$CH$_2$OCH$_3$ |
| 9 | —CN | —Cl |
| 10 | —CN | —CONHCH$_3$ |
| 11 | —CN | —CON(CH$_3$)$_2$ |
| 12 | —CN | (—COOCH$_3$)$_{70}$(—COOC$_2$H$_5$)$_{30}$ |

Examples of useful cyanoacrylate polymers include but are not limited to, poly(methyl-2-cyanoacrylate), poly(ethyl-2-cyanoacrylate), poly(n-butyl cyanoacrylate), poly(phenyl 2-cyanoacrylate), and poly(ethylhexyl 2-cyanoacrylate), copolymers of two or more different cyanoacrylate monomers such as poly(methyl-2-cyanoacrylate-co-ethyl-2-cyanoacrylate), and interpolymers of three or more cyanoacrylate monomers such as poly(methyl-2-cyanoacrylate-co-ethyl-2-cyanoacrylate-co-propyl-2-cyanoacrylate) and poly(methyl 2-cyanoacrylate-co-methoxyethyl 2-cyanoacrylate-co-ethyl 2-cyanoacrylate). Other useful cyanoacrylate polymers includes poly(alkoxyalkyl cyanoacrylates) such as poly(methoxyethyl-2-cyanoacrylate), and cyanoacrylate polymers that are prepared by copolymerizing one or more cyanoacrylate monomers represented by Structure (I) with one or more ethylenically-unsaturated copolymerizable monomers that are not represented by Structure (I), such as, for example, acrylates (such as ethyl acrylate, t-butyl acrylate, and isopropyl acrylate), methacrylates (such as ethyl methacrylate, t-butyl methacrylate, and isopropyl methacrylate), acrylamides, methacrylamides, acrylonitriles, methacrylonitriles, vinyl ethers, vinyl pyridines, vinyl pyrrolidones, vinyl acetate, vinyl halides, and dienes (such as butadienes and propylene), styrenes, α-methylstyrenes and other styrene derivatives, and other ethylenically unsaturated polymerizable monomers that would be readily apparent to one skilled in the polymer art.

Representative examples of cyanoacrylate polymers useful in this invention include the following:

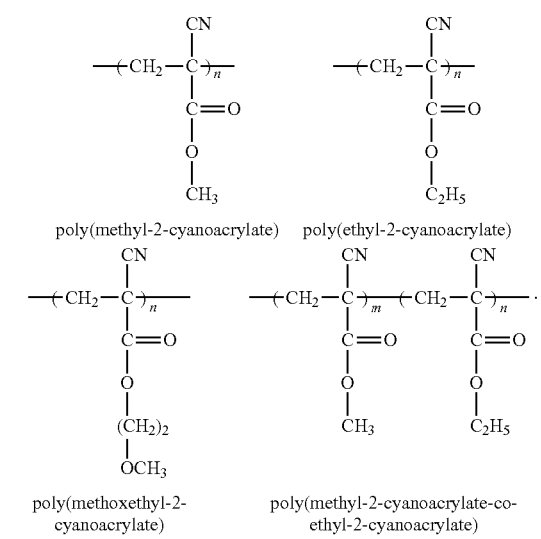

The composition comprise the one or more cyanoacrylate polymers as deposition inhibitor materials in an amount of at least 1 weight % and up to and including 100 weight %, or typically at least 50 weight % and up to and including 100 weight %, based on total composition dry weight.

The cyanoacrylate polymers are generally provided as emulsion polymers and are present in the composition in latex particulate form and can have a major dimension of at least 50 nm and up to and including 500 nm, but smaller and larger particles can be used if desired. In some embodiments, the cyanoacrylate is film-forming.

Methods useful for preparing the cyanoacrylate polymers used in the present invention are well known polymerization techniques using known starting materials (reactants, emulsifiers, and solvents). General instructions for preparing such cyanoacrylate polymers are provided for example in U.S. Pat. No. 5,605,780 (Burberry et al.) that is incorporated herein by reference.

When the deposition inhibitor material is applied to a receiver substrate from a donor element using thermal transfer processes, the composition comprising the deposition inhibitor material can also include one or more radiation absorbers that absorb radiation that can be used to thermally transfer the deposition inhibitor composition from a donor element using focused laser energy. For example, such radiation absorbers can be infrared radiation absorbers.

Useful infrared radiation absorbers include pigments such as carbon blacks including but not limited to carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET®200 or CAB-O-JET® 300 (manufactured by the Cabot Corporation) are also useful. Other useful carbon blacks are available from Cabot Billerica under the tradename Mogul. Other useful pigments include, but are not limited to, Heliogen Green, Nigrosine Base, iron (III) oxides, manganese oxide, Prussian Blue, and Paris Blue.

Examples of suitable infrared radiation-sensitive (IR) dyes as infrared radiation absorbers include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable IR dyes are described for example, in U.S. Pat. Nos. 4,973,572 (DeBoer), 5,208,135 (Patel et al.), 5,244,771 (Jandrue Sr. et al.), 5,401,618 (Chapman et al.), and 5,605,780 (noted above), and EP 0 823 327A1 (Nagasaka et al.), all of which are incorporated herein by reference.

Cyanine dyes having an anionic chromophore are also useful. For example, the cyanine dye can have a chromophore having two heterocyclic groups. In another embodiments, the cyanine dyes can have from about two sulfonic acid groups, such as two sulfonic acid groups and two indolenine groups as described for example in U.S Patent Application Publication 2005-0130059 (Tao) that is incorporated herein by reference.

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanabe et al.), all of which are incorporated herein by reference. Suitable dyes can be formed using conventional methods and starting materials or obtained from various commercial sources.

One useful infrared absorbing IR dye is 2-[2-[2-chloro-3-[(1,3-dihydro-1,1,3-trimethyl-2H-benz[e]indol-2-ylidene)ethylidene-1-cyclohexe-1-yl]ethenyl]-1,1,3-trimethyl-1H-benz[e]indolium 4-methylbenzene sulfonic acid salt.

One or more infrared radiation absorbers are generally present in the composition (or thermal transfer layer) comprising the deposition inhibitor material in an amount at least 0.1 weight % and up to and including 50 weight %, or typically in an amount of at least 1 weight % and up to and including 3 weight %, based on the total composition dry weight.

The composition comprising the deposition inhibitor material can also optionally comprise one or more co-inhibitors, as described for example, in U.S. Patent Application Publications 2009/0081827 (noted above), 2009/0051740 (noted above), and 2011/0120757 (noted above), all of which are incorporated herein by reference.

Alternatively, one or more radiation absorbers (as described above) can be incorporated into a layer adjacent the thermal transfer layer comprising the deposition inhibitor material. Such adjacent layers can be provided on the donor substrate using any known method including coating, solvent coating, lamination, evaporation coating, and sputter coating. Once this intermediate layer is applied, the composition comprising the inhibitor deposition material can be applied as described herein to form a thermal transfer layer. The radiation absorbers can be dispersed in a suitable binder such as an organic polymer or inorganic polymer in this intermediate layer.

Deposition Methods

The present invention provides various electronic devices including but not limited to, integrated circuits, active-matrix displays, solar cells, active matrix imagers, sensors, and rf labels using a suitable chemical vapor deposition method described herein.

Such electronic devices can have a receiver substrate that can be composed of polymeric films (such as polyethylene terephthalate, polyethylene naphthalate, polyimide, polyetheretherketone (PEEK), or any other polymer with suitable temperature resistance for electronics applications), ceramics, glasses, and metal foils including aluminum, steel, or stainless steel.

A deposited pattern of a composition that comprises a deposition inhibitor material as described herein can be applied to the receiver substrate. This composition comprises the cyanoacrylate polymer that is defined above. A deposited inorganic thin film is deposited only in selected areas of the receiver substrate where the composition comprising a deposition inhibitor material is absent. Useful thin films are described below.

The composition comprising the deposition inhibitor material can be applied in a patternwise fashion using any conventional printing technology. Particularly useful printing technologies are inkjet, flexography, gravure printing, microcontact printing, offset lithography, patch coating, screen printing, thermal or laser thermal ablation, and donor transfer methods (for example laser-induced thermal transfer from a donor element to a receiver element). The deposition inhibitor can also be applied uniformly by any of the above methods, or by hopper coating, spin coating blade coating, or dip coating. After uniform coating, the deposition inhibitor material can be patterned by exposure to radiation ranging from infrared to x-ray, mechanical embossing, or removal means, or by localized etching or surface treatment.

In some embodiments, the deposition methods comprise coating the composition comprising the deposition inhibitor material on the receiver substrate, followed by patterning the coated deposition inhibitor material by thermal ablation.

For example, the composition comprising the deposition inhibitor material on the substrate can be thus coated, followed by patterning the coated deposition inhibitor material by thermal ablation using a focused laser.

It is particularly useful to apply the composition comprising the deposition inhibitor material in a uniform or patternwise (or imagewise) fashion using laser induced thermal transfer from a suitable donor element.

For example, the deposition method can comprise patternwise the composition comprising the deposition inhibiting material on the receiver substrate by thermal transfer from a donor element comprising a thermal transfer layer comprising the composition comprising the deposition inhibitor material.

This donor element can comprise a suitable thermal transfer layer disposed on a suitable donor substrate such as a suitable polymeric film (for example a polyester, polycarbonate, polyolefin, or polystyrene film). The thermal transfer layer comprises the deposition inhibitor material, the cyanoacrylate polymer (as described above), and optionally, a radiation absorber such as an infrared radiation absorber (as described above) and any other desired addenda.

The donor element can be brought into contact with a suitable "receiver" substrate (such as polymeric films, papers, metals, ceramics, composites, laminates, and glass) to which the deposition inhibitor composition is to be transferred. The thermal transfer layer is generally placed in contact with the receiver substrate. The donor element and receiver substrate can be placed in direct contact with each other, meaning that no separation is intended. Alternatively, the donor element and receiver substrate can be separated for a suitable distance over which thermal transfer can be accomplished. Generally, this distance is up to and including 50 μm.

As noted above, the donor element can also include an intermediate layer, for example a conformable cushioning layer, between the thermal transfer layer and the donor substrate of the donor element and this intermediate layer can comprise the radiation absorber in suitable polymer binder such as polyolefin, in addition to the thermal transfer layer or instead of the thermal transfer layer. Alternatively, the donor element can comprise a radiation reflective layer such as a layer of evaporated metal between the donor substrate and the thermal transfer layer if the donor element is exposed through a transparent donor support, for example as described in U.S. Pat. No. 5,244,770 (DeBoer et al.) that is incorporated herein by reference.

The assembly of the donor element and the receiver substrate can be exposed to a suitable high intensity focused laser energy (for example an infrared laser beam or multiple beams) that transfers the composition comprising the deposition inhibitor material from the donor element to the receiver substrate, generally in a patternwise manner. The thermal transfer generally requires suitable thermal energy that can be determined using routine experimentation. No solution processing or post-transfer curing is generally required once the deposition inhibitor material has been transferred. Means for modulating one or more laser beams for this thermal transfer are well known in the art. They can be characterized as scanning mechanisms that cause the beam(s) to traverse the area of the donor element, delivering thermal transfer energy in a predetermined manner. Useful information about apparatus for carrying out the thermal transfer is described for example in U.S. Pat. Nos. 5,858,607 (noted above).

The functional thin film can be applied using a chemical vapor deposition (CVD) method, the general principles of which are described in many publications including Dobkin et al., *Principles of Chemical Vapor Deposition,* 1st Edition, April 2003 and the *Handbook of Chemical Vapor Deposition,* 2nd Ed: Principles, Technology and Applications (Materials Science and Process Technology Series), Pierson et al., Jan. 14, 2000. Specific types of CVD systems include the use of tube reactions as described in U.S. Pat. No. 6,709,525 (Song), showerhead reactors as described in U.S. Pat. No. 6,284,673 (Dunham), and linear injector reactors as described in U.S. Pat. No. 5,136,975 (Bartholomew et al.), all of which publications are incorporated herein by reference.

While these methods can be used, it is very desirable to use atomic layer deposition (ALD). ALD processes can be understood from the background section and various publications cited therein. Additional teaching about ALD and useful apparatus and procedures for using ALD to provide various devices comprising thin films is provided in U.S. Pat. Nos. 7,105,054 (Lindfors), 7,085,616 (Chin et al.), 7,141,095 (Aitchison et al.), 6,911,092 (Sneh), 7,846,644 (Irving et al.), and 8,017,183 (Yang et al.), all of which are incorporated herein by reference.

The present invention employs a deposition inhibitor material described above that inhibits the deposition of the thin films on its surface. In this manner, portions of the receiver substrate where there is a deposition inhibitor material will have little to no thin film growth, and in areas of the receiver substrate that are generally free of the deposition inhibitor material will have thin film growth. Cyanoacrylate polymers described above are not typically crosslinked. However, crosslinkable polymers can be used in combination with the cyanoacrylate polymers where crosslinking is performed after application of the polymer. Crosslinking of the polymer can increase its stability especially where the polymer remains in the constructed device. The cyanoacrylate polymers described above can be applied singly or as mixtures.

The process of making a patterned thin film of present invention can be carried out below a maximum substrate temperature of about 250° C., or typically below 180° C., or even at temperatures as low as room temperature (about 25° C.). The temperature selection generally depends upon the substrate that is used and processing parameters known in the art, once one has the knowledge of the present invention described herein. These temperatures are well below traditional integrated circuit and semiconductor processing temperatures, which enables the use of any of a variety of relatively inexpensive receiver substrates, such as flexible polymeric supports. Thus, the present invention enables the production of relatively inexpensive circuits containing thin film transistors with significantly improved performance.

In one embodiment, the method of this invention allows for the preparation of thin films using a system for delivery of gaseous materials to a substrate surface that can be adaptable to deposition on larger and web-based substrates and is capable of achieving a highly uniform thin film deposition at improved throughput speeds. This method optionally employs a continuous spatially dependent ALD (as opposed to pulsed or time dependent ALD) gaseous material distribution. The method of the present invention optionally allows operation at atmospheric or near-atmospheric pressures and is capable of operating in an unsealed or open-air environment. Because of the use of the deposition inhibitor material described above, the thin film is deposited only in selected areas of a receiver substrate.

Atomic layer deposition can be used to deposit a variety of inorganic thin films that are metals or that comprise a metal-containing compound. Such metal-containing compounds include, for example (with respect to the Periodic Table) a Group V or Group VI anion. Such metal-containing compounds can include but are not limited to, oxides, nitrides, sulfides, and phosphides, for example zinc, aluminum, titanium, hafnium, zirconium, and indium, and combinations of these metals. Useful metals include but are not limited to, copper, tungsten, aluminum, nickel, ruthenium, and rhodium.

The articles of the present invention and processes for preparing them can be better understood by reference to the FIGURES provided with this application. For example, referring to FIG. 1, a cross-sectional side view of one embodiment of a delivery head 10 for atomic layer deposition onto a substrate 20 according to the present invention is shown. Delivery head 10 has a gas inlet conduit 14 that serves as an inlet port for accepting a first gaseous material, a gas inlet conduit 16 for an inlet port that accepts a second gaseous material, and a gas inlet conduit 18 for an inlet port that accepts a third gaseous material. These gases are emitted at an output face 36 via output channels 12, having a structural arrangement that can include a diffuser, as described subsequently. The dashed line arrows in FIG. 1 refer to the delivery of gases to substrate 20 from delivery head 10. In FIG. 1, dotted line arrows X also indicate paths for gas exhaust (shown directed upwards in this figure) and exhaust channels 22, in communication with a gas output port 24 that provides an exhaust port. Since the exhaust gases can still contain quantities of unreacted gaseous materials (for example gaseous precursors), it can be undesirable to allow an exhaust flow predominantly containing one reactive species to mix with one predominantly containing another species. As such, it is recognized that the delivery head 10 can contain several independent exhaust ports.

In one embodiment, gas inlet conduits 14 and 16 are adapted to accept first and second gases that react sequentially on the surface of substrate 20 to effect ALD deposition, and gas inlet conduit 18 receives a purge gas that is inert with respect to the first and second gases. Delivery head 10 is spaced a distance D from substrate 20, which can be provided on a substrate support as is described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 1, substrate 20 is moved by a substrate support 96 across output face 36 in reciprocating fashion, as indicated by the arrow A and by phantom outlines to the right and left of substrate 20. It should be noted that reciprocating motion is not always required for thin-film deposition using delivery head 10. Other types of relative motion between substrate 20 and delivery head 10 could also be provided, such as movement of either substrate 20 or delivery head 10, or both, in one or more directions.

Figure 2:
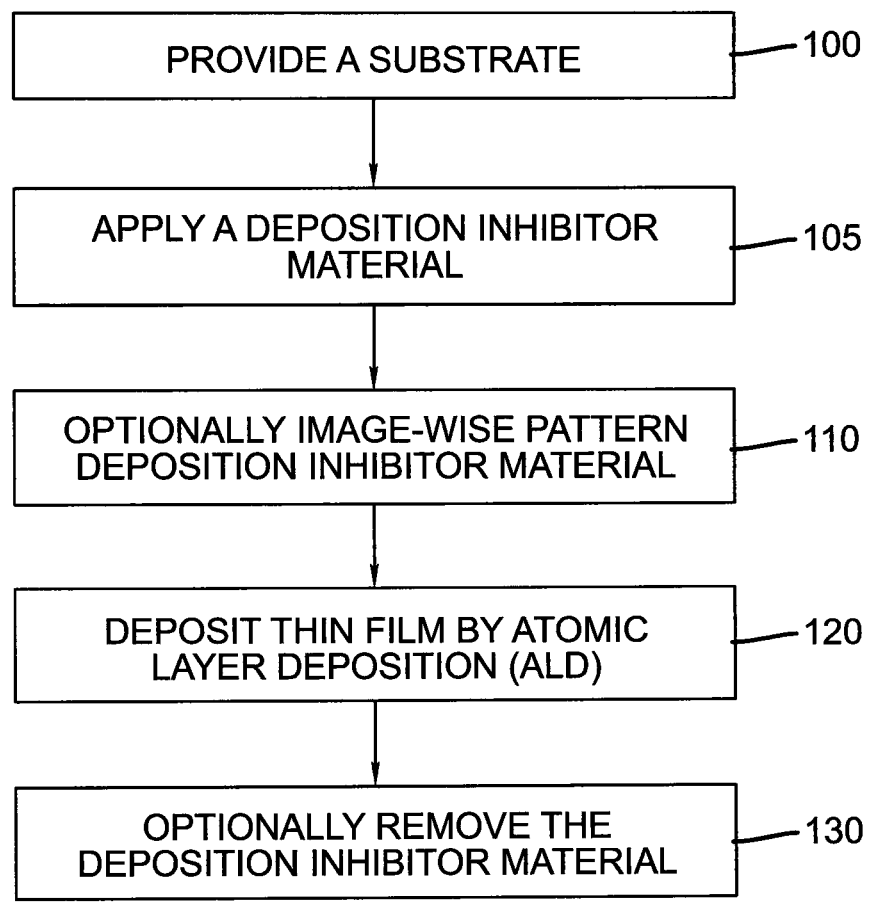
FIG. 2 is a flow chart describing one embodiment of the steps of the present invention.

FIG. 2 is a step diagram for one embodiment of a method of the present invention for making a patterned thin film using a combination of selected area deposition (SAD) and ALD. As shown in Step 100, a substrate is supplied for used in the process. In Step 105, a deposition inhibitor material (as described above) is deposited. The cyanoacrylate polymer deposition inhibitor material can be optimally chosen for the material to be deposited. Deposition of the deposition inhibitor material in Step 105 can achieved in a patterned manner, such as by using inkjet, flexography, gravure printing, microcontact printing, offset lithography, patch coating, screen printing, or donor transfer (described in more detail below). In an alternative embodiment, Step 105 can be used to deposit a uniform layer of the deposition inhibitor material and Step 110 can be optionally employed to form a patterned layer of the deposition inhibitor material.

Step 120 deposits the desired thin film, for example, by an Atomic Layer Deposition (ALD) process. Generically this deposition can use any suitable chemical vapor deposition equipment, such as ALD equipment, for example with a spatially dependent ALD system. The thin film is deposited only in the areas of the substrate where there is no deposition inhibitor material. Depending on the use of the thin film, the deposition inhibitor material can remain on the substrate for subsequent processing or can be removed as shown in Step 130 of FIG. 2.

In some embodiments, the deposition inhibitor material described above is characterized by an inhibition power. Referring to FIG. 13B, the inhibition power is defined as the thickness of a deposited layer that can form in the uninhibited areas 215 before the onset of significant deposition in the inhibited areas 210.

Figure 3:
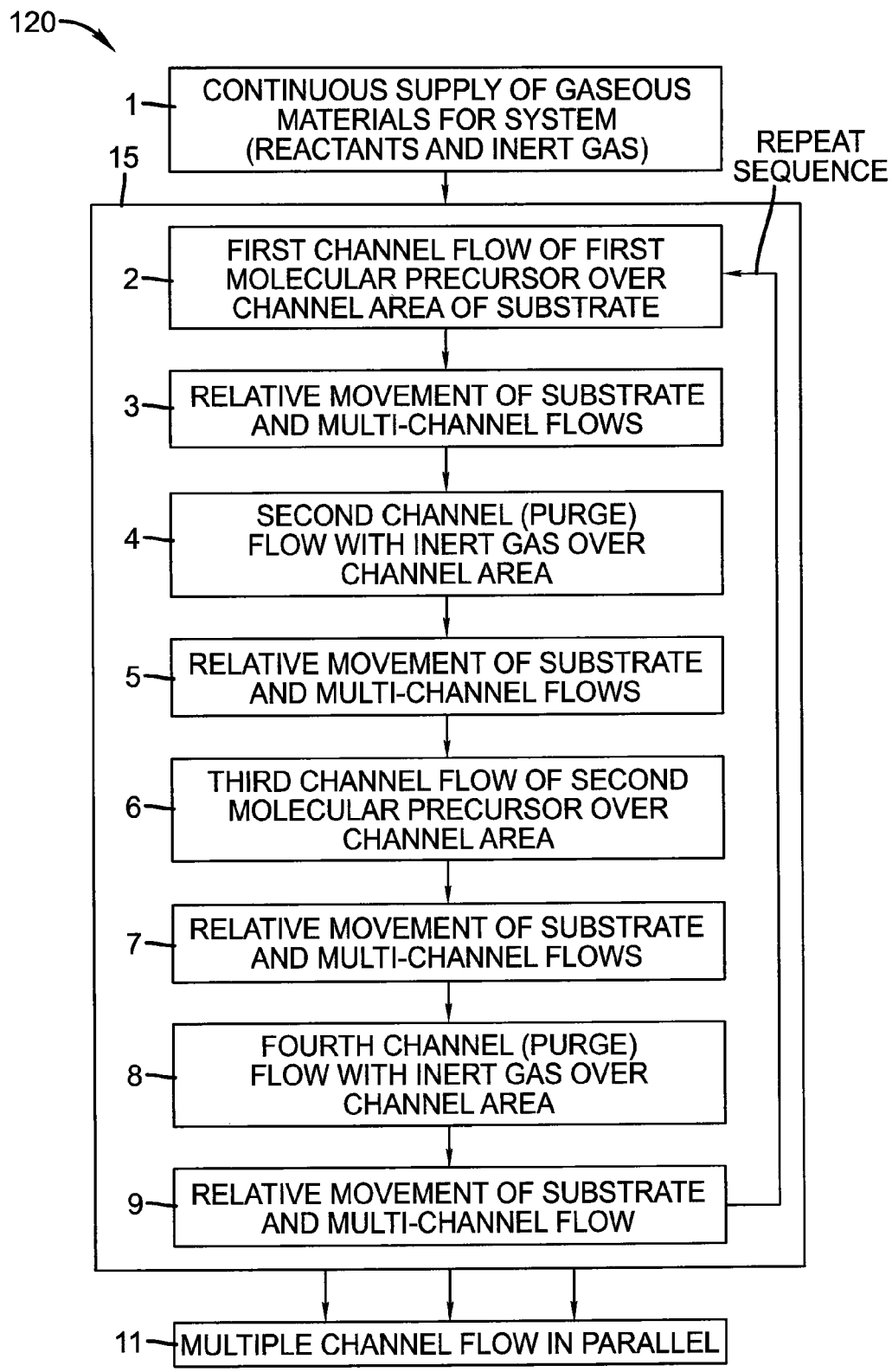
FIG. 3 is a flow chart describing the steps for an ALD process for use in the present invention.

FIG. 3 is a step diagram of a preferred embodiment of an ALD process 120 for making the thin film, in which two reactive gases are used, a first molecular precursor and a second molecular precursor. Gases are supplied from a gas source and can be delivered to the substrate, for example, using a deposition device. Metering and valving apparatus for providing gaseous materials to the deposition device can be used.

As shown in Step 1, a continuous supply of gaseous materials for the process is provided for depositing a thin film of material on a substrate. The Steps in Sequence 15 are sequentially applied. In Step 2, with respect to a given area of the substrate (referred to as the channel area), a first molecular precursor or reactive gaseous material is directed to flow in a first channel over the channel area of the substrate and reacts therewith. In Step 3, relative movement of the substrate and the multi-channel flows in the system occurs, which sets the stage for Step 4, in which second channel (purge) flow with inert gas occurs over the given channel area. In Step 5, relative movement of the substrate and the multi-channel flows sets the stage for Step 6, in which the given channel area is subjected to atomic layer deposition in which a second molecular precursor now over the given channel area of the substrate and reacts with the previous layer on the substrate to produce (theoretically) a monolayer of a desired material. A first molecular precursor is in gas form, for example, an organometallic compound such as diethylzinc or trimethyl-aluminum. In such an embodiment, the second molecular precursor is also in gaseous form and can be, for example, a nonmetallic oxidizing compound. The process of deposition can comprise flows of gaseous materials that are orthogonal towards the substrate, transverse across the face of the substrate, or some combination of both types of flows. For example, the channels comprise or are connected to a series of corresponding substantially parallel elongated openings in the output face of at least one delivery head for thin film deposition. More than one delivery head can be employed for deposition of one or more thin films.

In many forms of spatial ALD, the channels are small and in close proximity, with a length dimension in the direction of substrate motion that is less than 2 cm. Alternatively, the channel areas can be large areas of gas exposure as disclosed in U.S. Patent Application Publication 2007/0224348 (Dickey et al.) that is incorporated herein by reference.

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multichannels occurs again, which sets the stage for a repeat sequence, back to Step 2. The cycle can be repeated as many times as is necessary to establish a desired film. In this embodiment of the method, the steps are repeated with respect to a given channel area of the substrate, corresponding to the area covered by a flow channel. Meanwhile the various channels are being supplied with the necessary gaseous materials as in Step 1. Simultaneous with the sequence of box in FIG. 1, other adjacent channel areas are being processed, which results in multiple channel flows in parallel, as indicated in overall Step 11. As indicated above, parallel flow can be either substantially orthogonal or substantially parallel to the output face of the deposition device.

The primary purpose of the second molecular precursor is to condition the substrate surface back toward reactivity with the first molecular precursor. The second molecular precursor also provides material from the molecular gas to combine with metal at the surface, forming an oxide with the freshly deposited zinc-containing precursor.

This particular embodiment does not need to use a vacuum purge to remove a molecular precursor after applying it to the substrate. Purge steps are expected by most researchers to be the most significant throughput-limiting step in ALD processes.

Assuming that, for the two reactant gases in FIG. 3, AX and BY are used, for example. When the reaction gas AX flow is supplied over a given substrate area, atoms of the reaction gas AX are chemically adsorbed onto a substrate, resulting in a layer of A and a surface of ligand X (associative chemisorptions) (Step 2). The remaining reaction gas AX is then purged with an inert gas (Step 4). The flow of reaction gas BY and a chemical reaction between AX (surface) and BY (gas) occur, resulting in a molecular layer of AB on the substrate (dissociative chemisorptions) (Step 6). The remaining gas BY and byproducts of the reaction are purged (Step 8). The thickness of the thin film can be increased by repeating the process cycle (steps 2-9) multiple times.

Because the thin film can be deposited as one monolayer at a time it tends to be conformal and have uniform thickness.

Thin films of oxides that can be made using the method of the present invention include but are not limited to zinc oxide (ZnO), aluminum oxide ($Al_2O_3$), hafnium oxide, zirconium oxide, indium oxide, tin oxide, and others that would be readily apparent to a skilled worker. Mixed structure oxides that can be made using the process of the present invention can include but are not limited to InZnO. Doped materials that can be made using the process of the present invention can include but are not limited to ZnO:Al, $Mg_xZn_{1-x}O$, and LiZnO.

Thin metal films that can be made using the method of the present invention include but are not limited to, copper, tungsten, aluminum, nickel, ruthenium, and rhodium. It will be apparent to the skilled artisan that alloys of two, three, or more metals can be deposited, compounds can be deposited with two, three, or more constituents, and graded films and nano-laminates can be produced as well.

These variations are simply variants using particular embodiments of the present invention in alternating cycles. There are many other variations within the spirit and scope of the invention.

For various volatile zinc-containing precursors, precursor combinations, and reactants useful in ALD thin film processes, reference is made to the *Handbook of Thin Film Process Technology*, Vol. 1, edited by Glocker and Shah, Institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be also used by suitable surface treatment.

Figure 4:
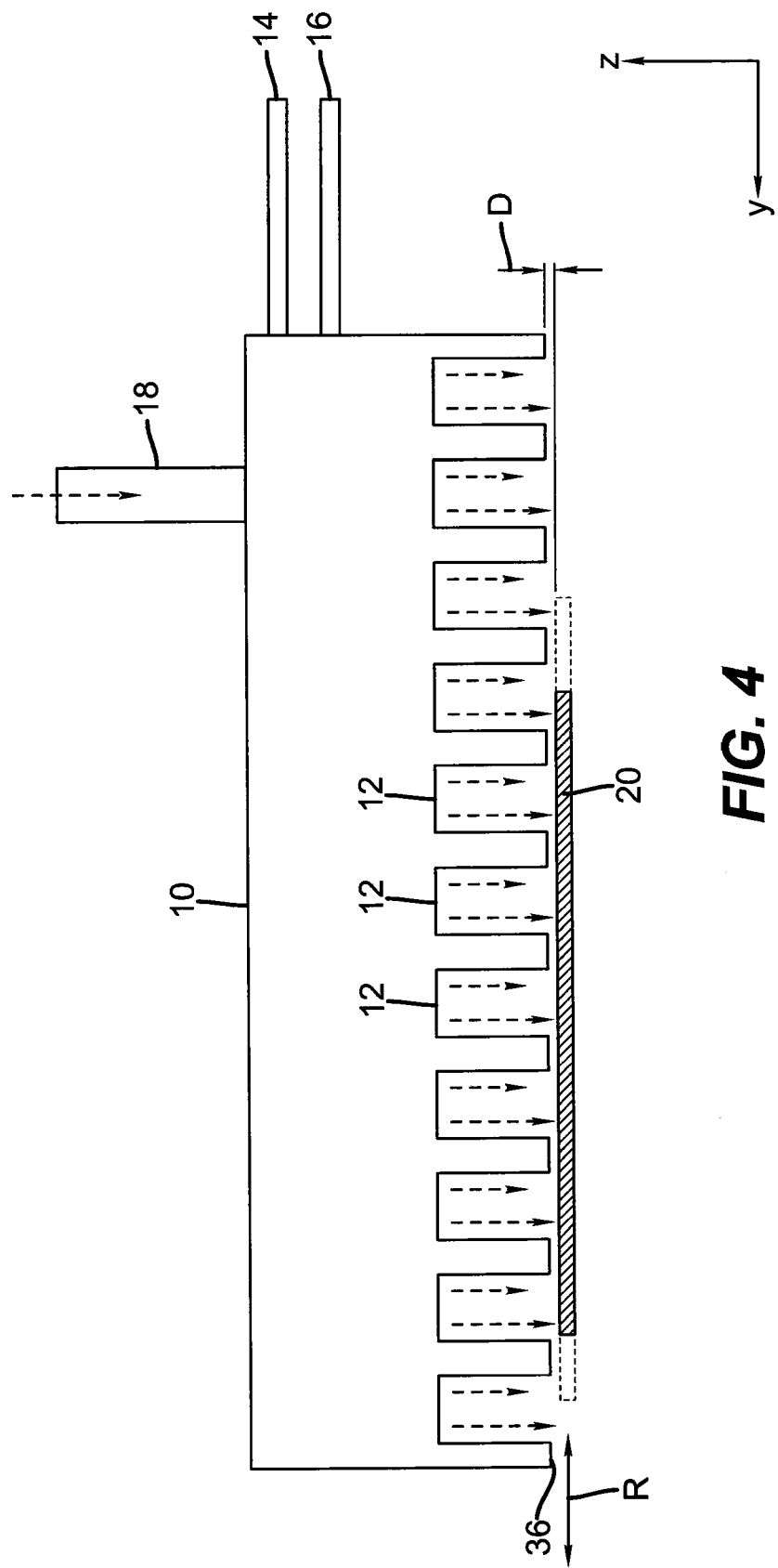
FIG. 4 is a cross-sectional side view of one embodiment of a deposition device for atomic layer deposition that can be used in the present invention.

FIG. 4 shows a cross-sectional side view of one embodiment of delivery head 10 that can be used for atomic layer deposition onto substrate 20 according to the present invention. Delivery head 10 has gas inlet port 14 for accepting a first gaseous material, gas inlet port 16 for accepting a second gaseous material, and gas inlet port 18 for accepting a third gaseous material. These gases are emitted at output face 36 via output channels 12, having a structural arrangement described subsequently. The arrows in FIG. 4 and subsequent FIGS. 6A and 6B refer to the diffusive transport of the gaseous material, and not the flow, received from an output channel. In this particular embodiment, the flow is substantially directed out of the page of the figure, as described further below.

In one embodiment, gas inlet ports 14 and 16 are adapted to accept first and second gases that react sequentially on the substrate surface to effect ALD deposition, and gas inlet port 18 receives a purge gas that is inert with respect to the first and second gases. Delivery head 10 is spaced a distance D from substrate 20, provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 4, substrate 20 is moved across output face 36 in reciprocating fashion, as indicated by arrow R and by phantom outlines to the right and left of substrate 20 in FIG. 4. It should be noted that reciprocating motion is not always required for thin-film deposition using delivery head 10. Other types of relative motion between substrate 20 and delivery head 10 could also be provided, such as movement of either substrate 20 or delivery head 10 in one or more directions, as described in more detail below.

Figure 5:
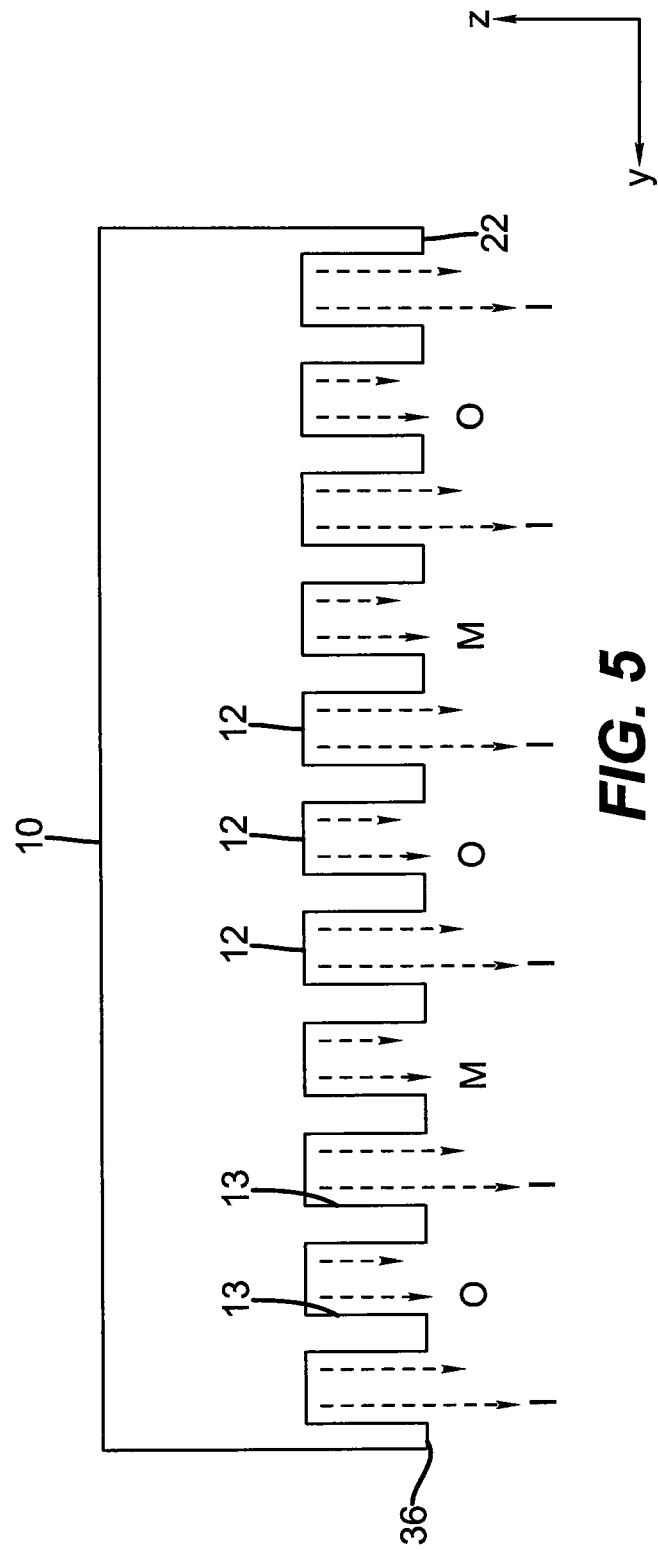
FIG. 5 is a cross-sectional side view of an embodiment, for one exemplary system of gaseous materials, of the distribution of gaseous materials to a substrate that is subject to thin film deposition.

The cross-sectional view of FIG. 5 shows gas flows emitted over a portion of output face 36 of delivery head 10. In this particular arrangement, each output channel 12, separated by partitions 13, is in gaseous flow communication with one of gas inlet ports 14, 16, or 18 seen in FIG. 4. Each output channel 12 delivers typically a first reactant gaseous material O, or a second reactant gaseous material M, or a third inert gaseous material I.

FIG. 5 shows a relatively basic or simple arrangement of gases. It is envisioned that a plurality of non-metal deposition precursors (like material O) or a plurality of metal-containing precursor materials (like material M) can be delivered sequentially at various ports in a thin-film single deposition. Alternately, a mixture of reactant gases, for example, a mixture of metal precursor materials or a mixture of metal and non-metal precursors can be applied at a single output channel when making complex thin film materials, for example, having alternate layers of metals or having lesser amounts of dopants admixed in a metal oxide material. The interstream labeled I separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 5 and following suggests some typical types of reactant gases. For example, first reactant gaseous material O can be an oxidizing gaseous material. Second reactant gaseous material M can be an organo-metallic compound. In an alternative embodiment, O can represent a nitrogen- or sulfur-containing gaseous material for forming nitrides and sulfides. Inert gaseous material I can be nitrogen, argon, helium, or other gases commonly used as purge gases in ALD processes. Inert gaseous material I is inert with respect to first or second reactant gaseous materials O and M. Reaction between the first and second reactant gaseous materials would form a metal oxide or other binary compound, such as zinc oxide ZnO, in one embodiment. Reactions between more than two reactant gaseous materials can form other materials such as a ternary compound, for example, ZnAlO.

Figure 6A:
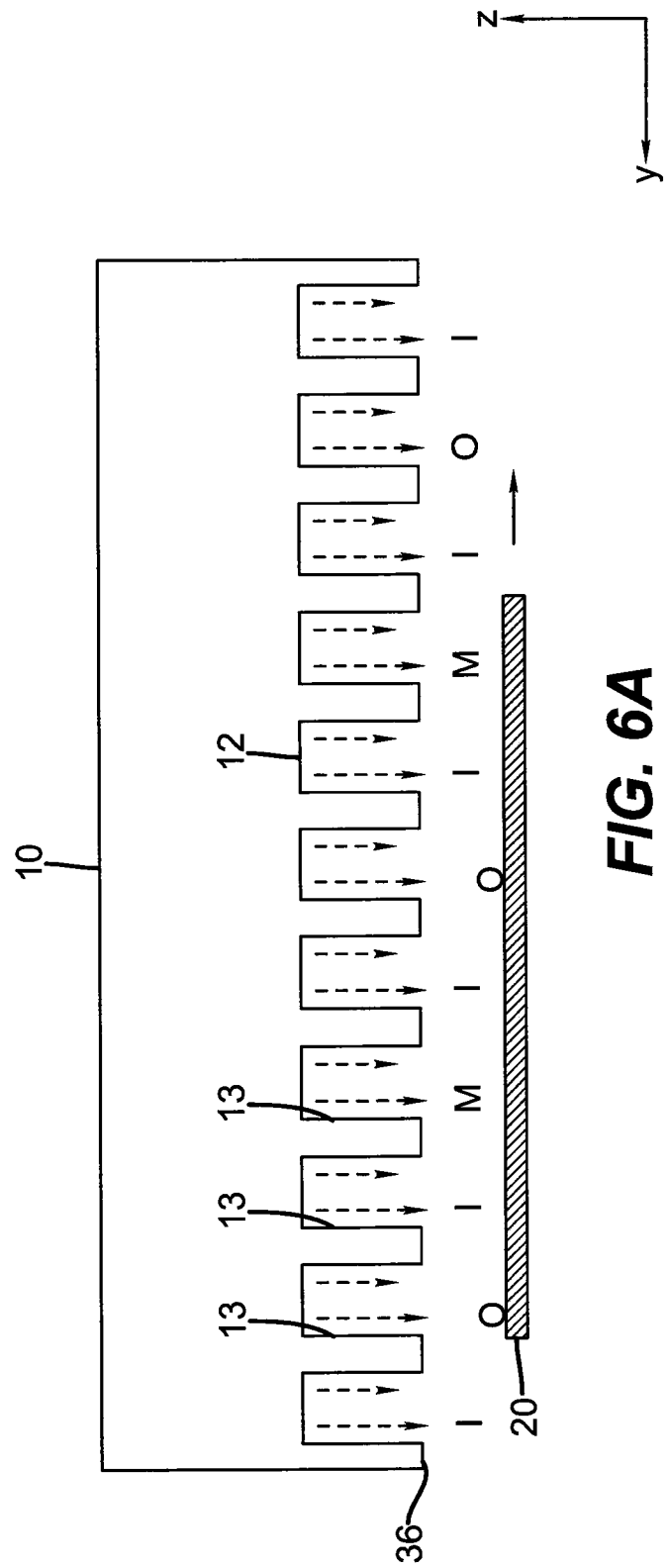
FIGS. 6A and 6B are cross-sectional side views of one embodiment of the distribution of a system of gaseous materials, schematically showing the accompanying deposition operation.
Figure 6B:
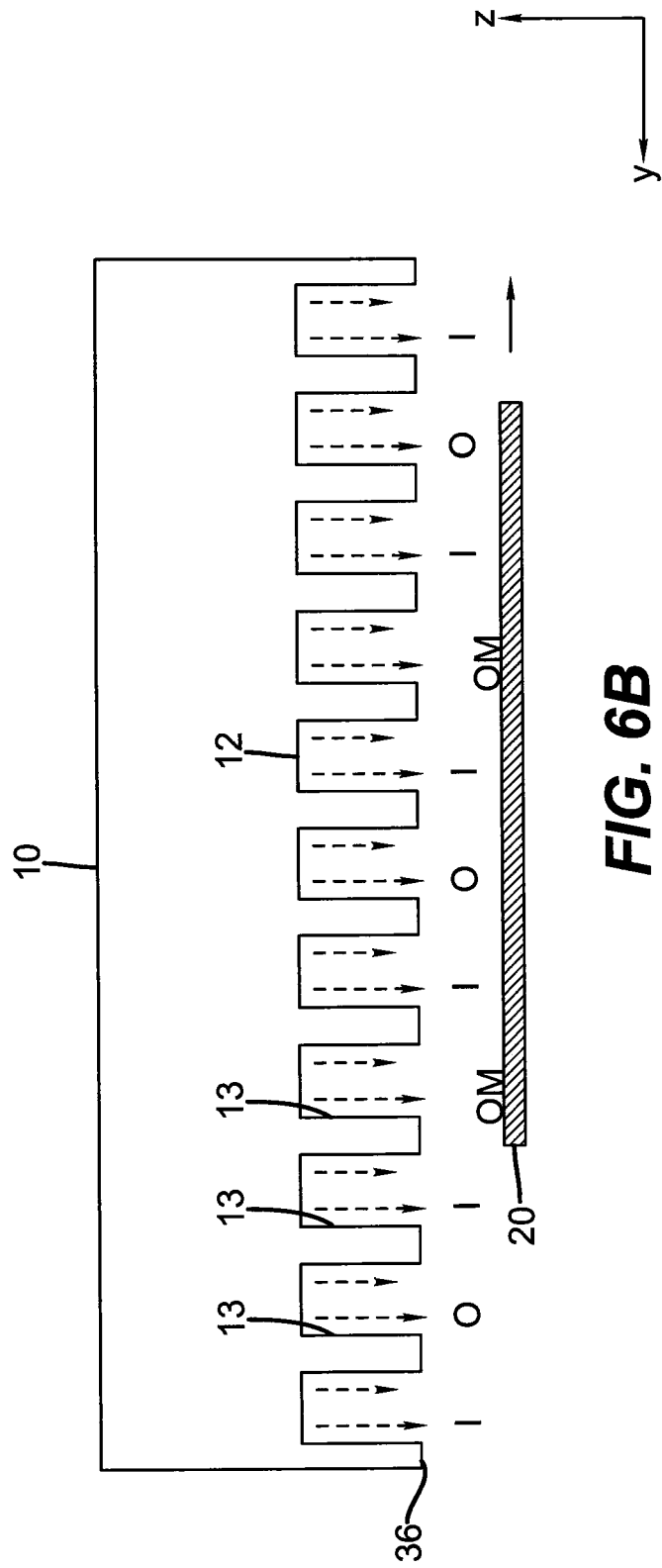

The cross-sectional views of FIGS. 6A and 6B show, in simplified schematic form, the ALD coating operation performed as substrate 20 passes along output face 36 of delivery head 10 when delivering reactant gaseous materials O and M. In FIG. 6A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials.

As FIGS. 6A and 6B show, inert gaseous material is provided in every alternate output channels 12, between the flows of first and second reactant gaseous materials O and M. Sequential output channels 12 are adjacent, that is, share a common boundary, formed by partitions 13 in the embodiments shown. Here, output channels 12 are defined and separated from each other by partitions 13 that extend at a perpendicular to the surface of substrate 20.

As mentioned above, in this particular embodiment, there are no vacuum channels interspersed between the output channels 12, that is, no vacuum (exhaust) channels on either side of a channel delivering gaseous materials to draw out the gaseous materials around the partitions. This advantageous, compact arrangement is possible because of the innovative gas flow that is used. Gas delivery arrays, in one embodiment, can apply substantially vertical (that is, perpendicular) gas flows against the substrate, but then must usually draw off spent gases in the opposite vertical direction, so that exhaust openings and channels would be desirable. A delivery head 10 that directs a gas flow (preferably substantially laminar in one embodiment) along the surface for each reactant and inert gas can more easily handle spent gases and reaction by-products in a different manner, as described below. Thus, in one useful embodiment, the gas flow is directed along and generally parallel to the plane of the substrate surface. In other words, the flow of gases is substantially transverse to the plane of a substrate rather than perpendicular to the substrate being treated.

Figure 7:
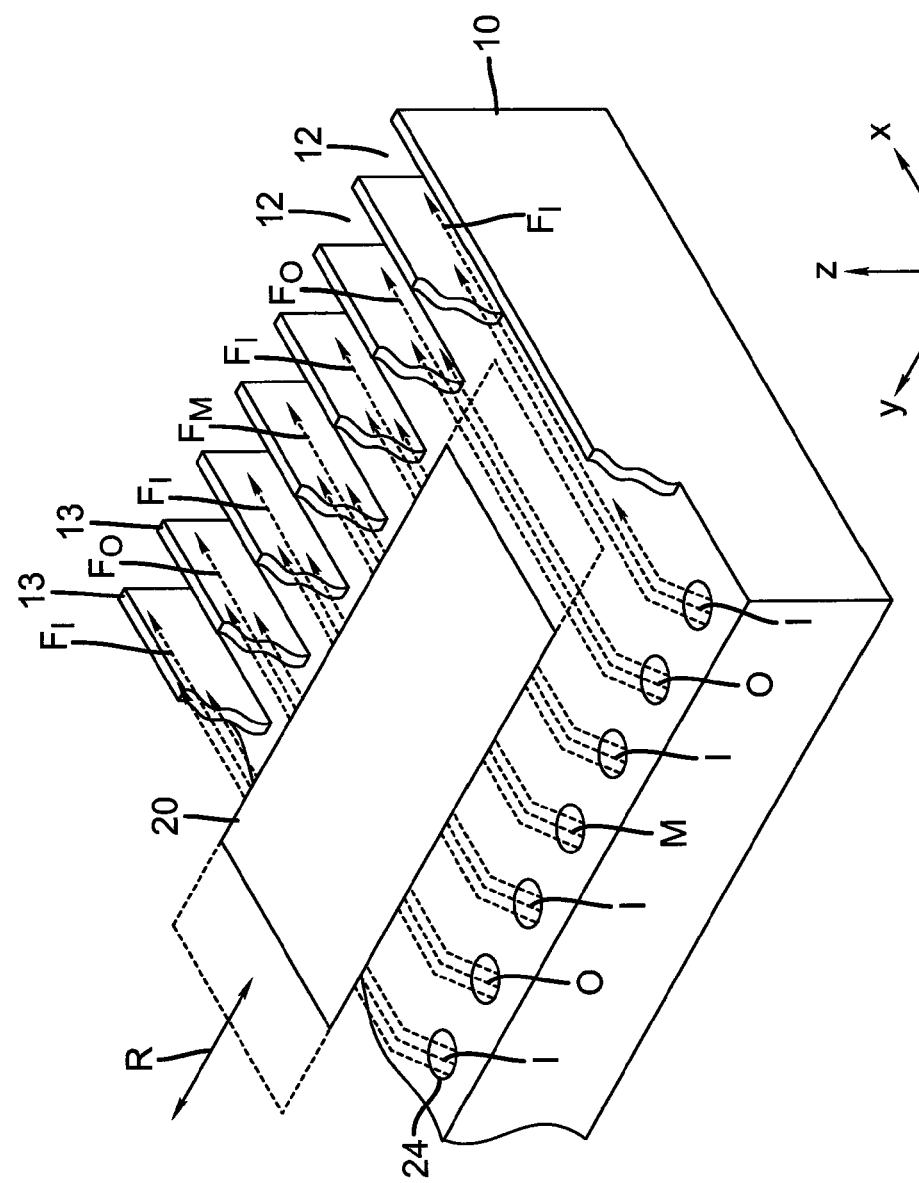
FIG. 7 is a perspective view, from the output face side, of a portion of one embodiment of a deposition device, showing the orientation of output channels relative to the substrate and reciprocating motion, showing one exemplary arrangement of gas flow in the deposition device.

FIG. 7 shows a perspective view of one such embodiment of delivery head 10 that can be used in the present process, from the output face 36 (that is, from the underside with respect to FIGS. 4-6B). Partitions 13 that define and separate the adjacent output channels 12 in this embodiment are represented as partially cut away, to allow better visibility for the gas flows flowing from gas outlet ports 24. FIG. 7 also shows reference x,y,z coordinate axis assignments. Output channels 12 are substantially in parallel and extend in a length direction that corresponds to the x coordinate axis. Reciprocating motion of substrate 20, or motion relative to substrate 20, is in the y coordinate direction, using this coordinate assignment.

FIG. 7 shows gas flows $F_I$, $F_O$, and $F_M$ for the various gaseous materials delivered from delivery head 10 with this embodiment. Gas flows $F_I$, $F_O$, and $F_M$ are in the x-direction, that is, along the length of elongated output channels 12.

Figure 8:
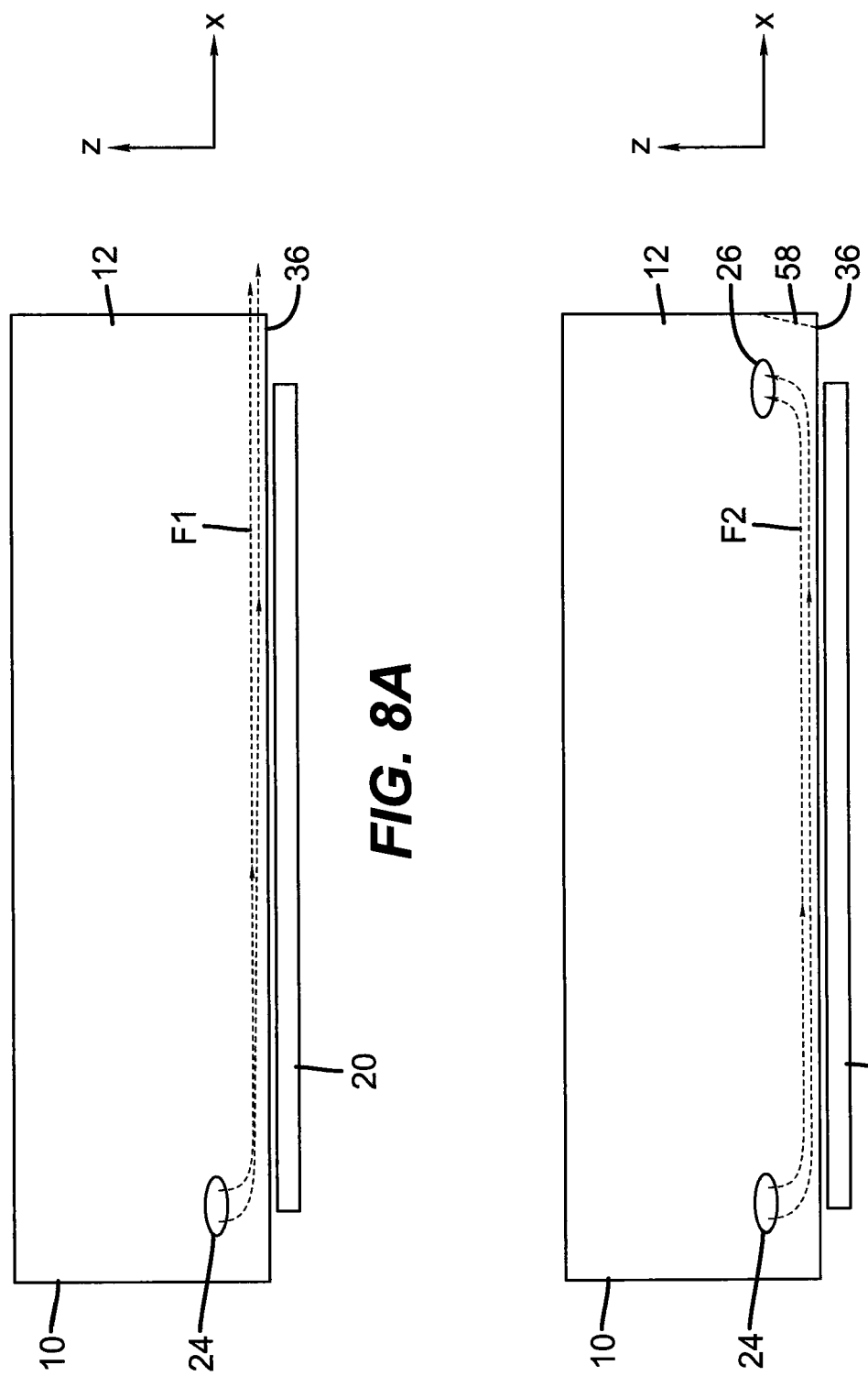
FIGS. 8A and 8B are cross-sectional views taken orthogonally to the cross-sectional views of previous FIGS. 4, 5, 6A, and 6B, showing gas flow directions for output channels in various embodiments.

The cross-sectional views of FIGS. 8A and 8B are taken orthogonally to the cross-sections of FIGS. 4-6B and show gas flows in one direction from this view. Within each output channel 12, the corresponding gaseous material flows from a gas output port 24, shown in phantom in the views of FIGS. 8A and 8B. In the embodiment of FIG. 8A, gas flow F1 directs the gaseous material along the length of output channel 12 and across substrate 20, as was described with reference to FIG. 7. Flow F1 continues past the edge of delivery head 10 in this arrangement, flowing outward into the environment or, if desirable, to a gas collection manifold (not shown). FIG. 8B shows an alternative embodiment for gas flow F2 in which output channel 12 also provides an exhaust port 26 for redirection or drawing off of the gas flow. Although unidirectional flows are useful, some degree of mixing can occur and even may be beneficial to some extent, depending on the flow rates and other circumstances involved in a particular application.

A particular delivery head 10 can use output channels 12 configured using any one of the gas flow configurations or combinations thereof, either the F1 flow of FIG. 8A, the F2 flow of FIG. 8B, or some other variation in which gaseous material is directed to flow across substrate 20 along output channel 12, for example in a substantially laminar or smooth fashion with controlled mixing. In one embodiment, one or more exhaust ports 26 are provided for each output channel 12 that delivers a reactant gaseous material. For example, referring to FIG. 7, output channels 12 for first and second reactant gaseous materials, labeled O and M, are configured with exhaust ports 26 to vent or draw off the reactant substances, following the pattern of flow F2 (FIG. 8B). This allows some recycling of materials and prevents undesirable mixing and reaction near the end of the manifold. Output channels 12 for inert gaseous material, labeled I, do not use exhaust ports 26 and thus follow the pattern of flow F1 (FIG. 8A). Although laminar flows are useful in some embodiments, some degree of mixing can occur and even may be beneficial to some extent, depending on the flow rates and other circumstances involved in a particular application.

Exhaust port 26 is not a vacuum port, in the conventional sense, but is simply provided to draw off the gaseous flow in its corresponding output channel 12, thus facilitating a uniform gas flow pattern within the channel. A negative draw, just slightly less than the opposite of the gas pressure at gas output port 24, can help to facilitate an orderly gas flow. The negative draw can, for example, operate at a pressure of between 0.9 and 1.0 atmosphere (0.9 to $1.013 \times 10^5$ Pascals), whereas a typical vacuum is, for example, below 0.1 atmospheres (0.1013 Pascals). An optional baffle 58, as shown in dotted outline in FIG. 8B, can be provided to redirect the flow pattern into exhaust port 26.

Because no gas flow around partition 13 to a vacuum exhaust is needed, output face 36 can be positioned very closely, to within about 1 mil (approximately 0.025 mm) of the substrate surface. By comparison, an earlier approach such as that described in the U.S. Pat. No. 6,821,563 (Yudovsky) required gas flow around the edges of channel sidewalls and was thus limited to 0.5 mm or greater distance to the substrate surface. Positioning the delivery head 10 closer to the substrate surface is useful in the present invention.

In order to provide smooth flow along the length of output channel 12, gas output port 24 can be inclined at an angle away from normal, as indicated in FIGS. 8A and 8B. Optionally, some type of gas flow redirecting structure can also be used to redirect a downward flow from gas output port 24 so that it forms a gas flow that runs substantially in parallel to output face 36.

As was particularly described with reference to FIGS. 6A and 6B, delivery head 10 requires movement relative to the surface of substrate 20 in order to perform its deposition function. This relative movement can be obtained in a number of ways, including movement of either or both delivery head 10 and substrate 20, such as by movement of a process that provides a substrate support. Movement can be oscillating or reciprocating or can be a continuous movement, depending on how many deposition cycles are needed. Rotation of a substrate can also be used, particularly in a batch process, although continuous processes are particularly useful.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For example, delivery head 10, having a nominal channel width of 0.034 inches (0.086 cm) in width W for each output channel 12 and reciprocating motion (along the y axis as used herein) of at least 0.20 inches (0.51 cm) would be required. For this example, an area of substrate 20 would be exposed to both first reactant gaseous material O and second reactant gaseous material M with movement over this distance. In some cases, consideration for uniformity can require a measure of randomness to the amount of reciprocating motion in each cycle, such as to reduce edge effects or build-up along the extremes of reciprocation travel.

Delivery head 10 can have only enough output channels 12 to provide a single cycle. Alternatively, delivery head 10 can have an arrangement of multiple cycles, enabling it to cover a larger deposition area or enabling its reciprocating motion over a distance that allows two or more deposition cycles in one traversal of the reciprocating motion distance.

In one embodiment, a given area of the substrate is exposed to a gas flow in a channel for less than 500 milliseconds, or typically for less than 100 milliseconds. For example, the temperature of the substrate during deposition is less than 600° C. or typically less than 250° C.

For example, in one particular application, it was found that each O-M cycle formed a layer of one atomic diameter over about of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 9:
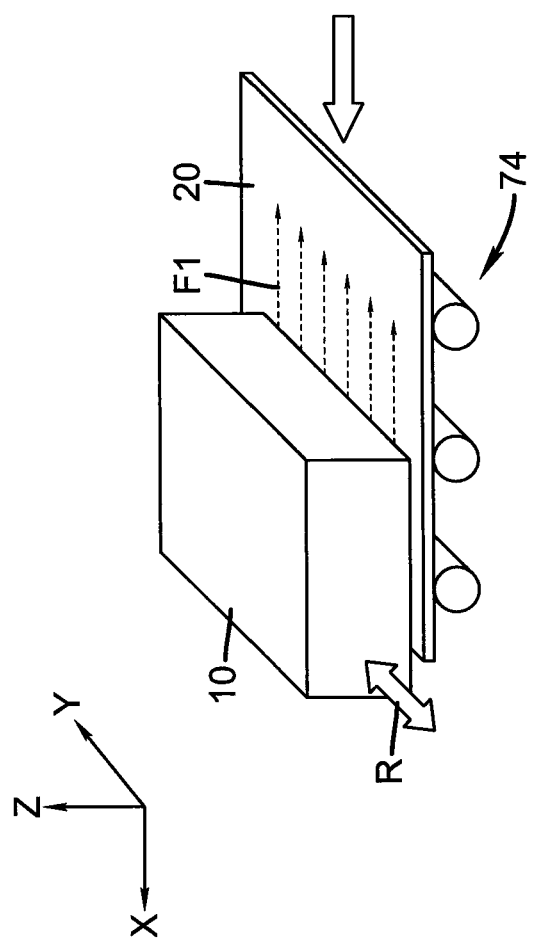
FIG. 9 is a schematic diagram showing an alternative motion pattern for reciprocating and orthogonal movement.

An advantage of the reciprocating motion used for a delivery head used in one embodiment of the present process is that it allows deposition onto a substrate 20 whose area exceeds the area of output face 36. FIG. 9 schematically shows how this broader area coverage can be affected using reciprocating motion along the y axis as shown by arrow R and also movement orthogonal or transverse to the reciprocating motion, relative to the x axis. Again, it should be noted that motion in either the x or y direction, as shown in FIG. 9, can be effected either by movement of delivery head 10, or by movement of substrate 20 provided with a substrate support 74 that provides movement, or by movement of both delivery head 10 and substrate 20.

In FIG. 9 the relative motion of the delivery head 10 and the substrate 20 are perpendicular to each other. It is also possible to have this relative motion in parallel. In this case, the relative motion needs to have a nonzero frequency component that represents the oscillation and a zero frequency component that represents the displacement of the substrate 20. This combination can be achieved by (1) an oscillation combined with displacement of the delivery head 10 over a fixed substrate, (2) an oscillation combined with displacement of the substrate 20 relative to a fixed substrate delivery head 10, or (3) any combinations wherein the oscillation and fixed motion are provided by movements of both the substrate 20 and the delivery head 10.

In one embodiment, ALD can be performed at or near atmospheric pressure and over a broad range of ambient and substrate temperatures, for example at a temperature of less than 300° C. Generally, a relatively clean environment is needed to minimize the likelihood of contamination. However, full "clean room" conditions or an inert gas-filled enclosure is not be required for obtaining good performance when using some embodiments of the method of the present invention.

Figure 10:
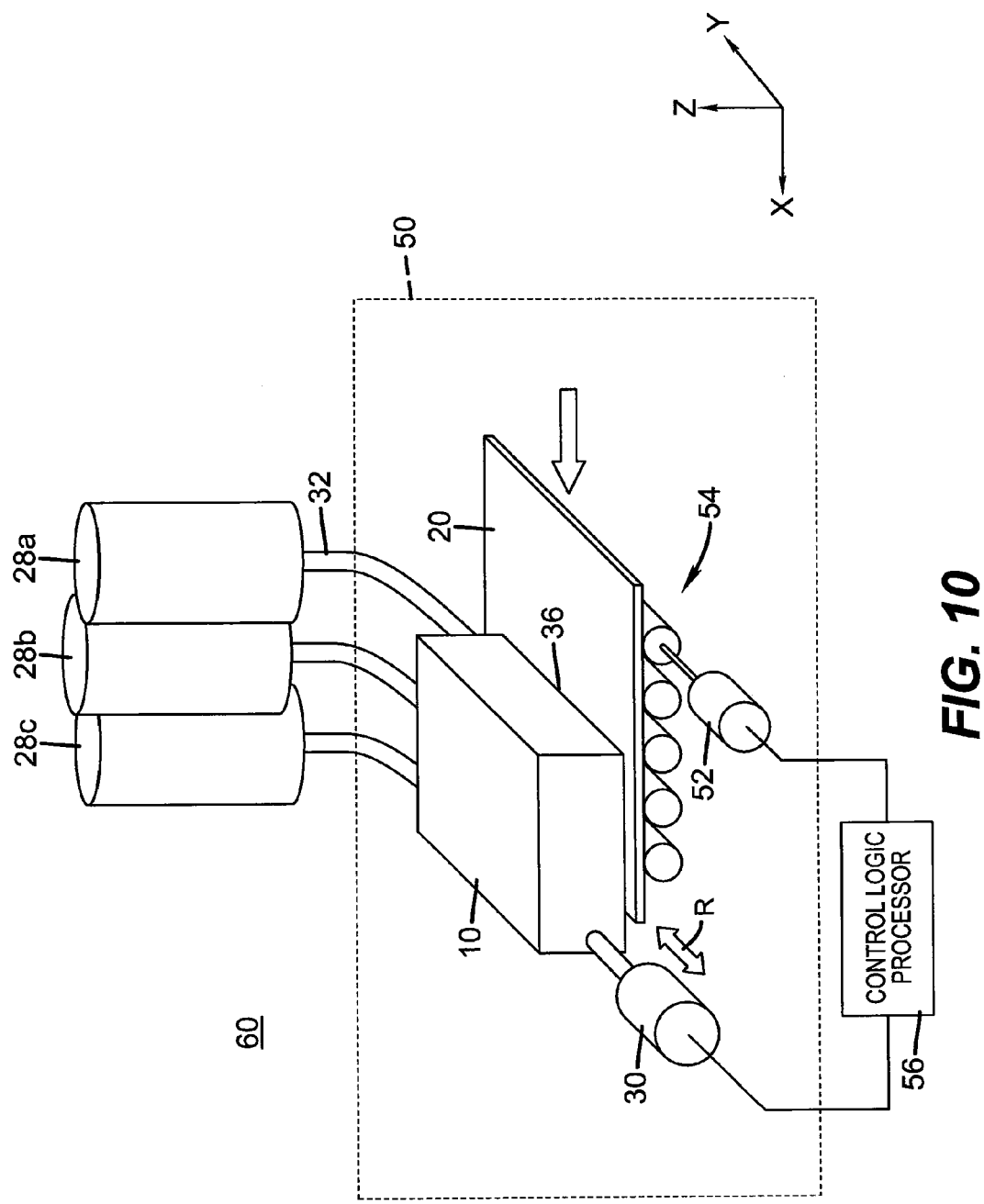
FIG. 10 is a block diagram for one embodiment of a deposition system that uses the method according to the present invention.

FIG. 10 shows an Atomic Layer Deposition (ALD) 60 process, for making a thin film, having a chamber 50 for providing a relatively well-controlled and contaminant-free environment. Gas supplies 28a, 28b, and 28c provide the first, second, and third gaseous materials to delivery head 10 through supply lines 32. The optional use of flexible supply lines 32 facilitates ease of movement of delivery head 10. For simplicity, an optional vacuum vapor recovery process and other support components are not shown in FIG. 10 but could also be used. A transport subsystem 54 provides a substrate support that conveys substrate 20 along output face 36 of delivery head 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 10, control logic processor 56 controls an actuator 30 for providing reciprocating motion to delivery head 10 and also controls a transport motor 52 of transport subsystem 54.

Figure 11:
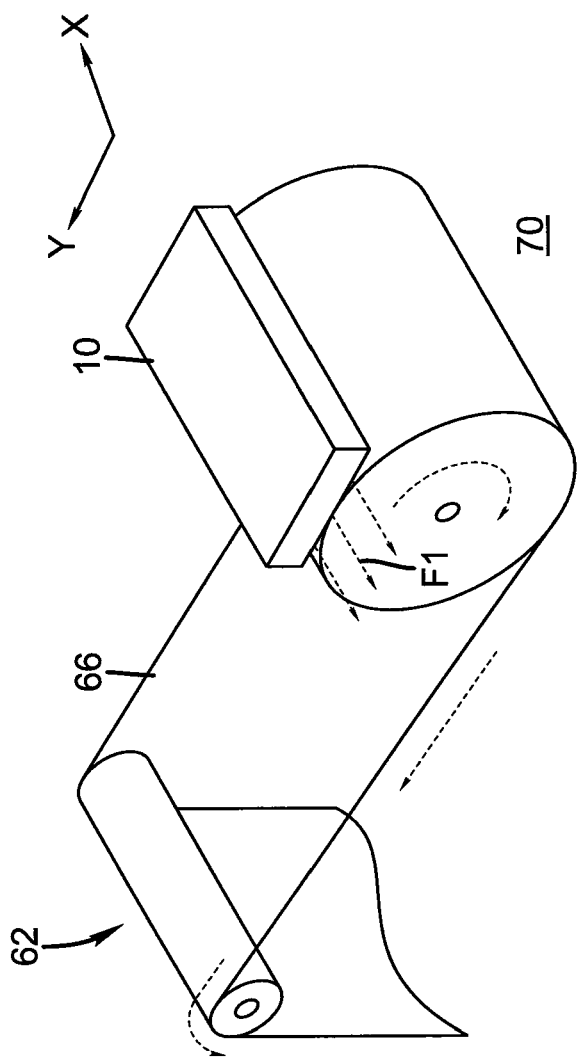
FIG. 11 is a block diagram showing another embodiment of deposition system applied to a moving web in accordance with the present invention, with the deposition device being kept stationary.

FIG. 11 shows an Atomic Layer Deposition (ALD) system 70 for depositing a thin film in a web arrangement, using a stationary delivery head 10 in which the flow patterns are oriented orthogonally to the configuration of FIG. 10. In this arrangement, motion of web conveyor 62 provides the movement needed for ALD deposition. Reciprocating motion can also be used in this environment, such as by repeatedly reversing the direction of rotation of a web roller to move web substrate 66 forward and backwards relative to delivery head 10. Reciprocation motion can also be obtained by allowing a reciprocating motion of the delivery head 10 across an arc whose axis coincides with the roller axis, while the web substrate 66 is moved in a constant motion. In another embodiment at least a portion of delivery head 10 has an output face 36 having an amount of curvature (not shown), which might be advantageous for some web coating applications. Convex or concave curvature could be provided.

Optionally, the present method can be accomplished with other apparatus or systems described in more detail in U.S. Pat. Nos. 7,413,982 (Levy) and 7,456,429 (Levy) and U.S. Patent Application Publications 2008/0166884 (Nelson et al.) and 2009/0130858 (Levy), all of which incorporated herein by reference.

In the embodiments described in the latter three publications, a delivery device having an output face for providing gaseous materials for thin-film material deposition onto a substrate comprises elongated emissive channels in at least one group of elongated emissive channels, of the three groups of elongated emissive channels (namely, at least one group of: (i) one or more first elongated emissive channels, (ii) one or more second elongated channels, and (iii) a plurality of third elongated channels) that is capable of directing a flow, respectively, of at least one of the first gaseous material, second gaseous material, and the third gaseous material substantially orthogonally with respect to the output face of the delivery device, which flow of gaseous material is capable of being provided, either directly or indirectly from each of the elongated emissive channels in the at least one group, substantially orthogonally to the surface of the substrate.

In one embodiment, apertured plates are disposed substantially in parallel to the output face, and apertures on at least one of the apertured plates form the first, second, and third elongated emissive channels. In an alternative embodiment, the apertured plates are substantially perpendicularly disposed with respect to the output face.

In one such embodiment, the deposition device comprises exhaust channels, for example, a delivery device for thin-film material deposition onto a substrate comprising: (a) a plurality of inlet ports comprising at least a first inlet port, a second inlet port, and a third inlet port capable of receiving a common supply for a first reactive gaseous material, a second reactive gaseous material, and a third (inert purge) gaseous material, respectively, (b) at least one exhaust port capable of receiving exhaust gas from thin-film material deposition and at least two elongated exhaust channels, each of the elongated exhaust channels capable of gaseous fluid communication with the at least one exhaust port, and (c) at least three pluralities of elongated output channels, (i) a first plurality of first elongated output channels, (ii) a second plurality of second elongated output channels, and (iii) a third plurality of third elongated output channels, each of the first, second, and third elongated output channels capable of gaseous fluid communication, respectively, with one of the corresponding first inlet port, second inlet port, and third inlet port; wherein each of the first, second, and third elongated output channels and each of the elongated exhaust channels extend in a length direction substantially in parallel; wherein each first elongated output channel is separated on at least one elongated side thereof from a nearest second elongated output channel by a relatively nearer elongated exhaust channel and a relatively less near third elongated output channel; and wherein each first elongated emissive channel and each second elongated emissive channel is situated between relatively nearer elongated exhaust channels and between relatively less nearer elongated emissive channels.

Further embodiments can comprise a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels.

In one embodiment, such a gas diffuser is capable of providing a friction factor for gaseous material passing there through that is greater than $1 \times 10_2$, thereby providing back pressure and promoting equalization of pressure where the flow of the at least one first, second and third gaseous material exits the delivery device. In one embodiment of the present invention, the gas diffuser comprises a porous material through which the at least one of the first, second, and third gaseous material passes. In a second embodiment of the present invention, the gas diffuser comprises a mechanically formed assembly comprising at least two elements comprising interconnected passages, for example, in which nozzles are connected to a flow path provided by a thin space between parallel surface areas in the two elements.

In some embodiments, the one or more gas flows from the deposition devices provide a pressure that at least contributes to the separation of the surface of the substrate from the face of the delivery head, thereby providing a "floating head" or "air bearing" type delivery head, which can help to stabilize the gas flows and limit intermixing of the gas flows.

The method of the present invention is advantaged in its capability to perform deposition onto a substrate over a broad range of temperatures, including room or near-room temperature in some embodiments. The method can operate in a vacuum environment, but is particularly well suited for operation at or near atmospheric pressure.

It should be recognized that any useful ALD equipment can be used with deposition inhibitor materials. Other spatial ALD processes, such as those as described by previously referenced publications by Yudovsky and Dickey et al. and described in U.S. Pat. No. 4,413,022 (Suntola et al.) are also useful with the practice of the present invention. Traditional chamber based or temporal ALD processes can also be used with the polymeric deposition inhibitor materials described above.

Figure 12A:
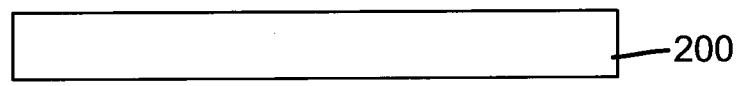
FIGS. 12A through 12E show the layers on the substrate at different points in the process in one embodiment of the present invention.
Figure 12B:
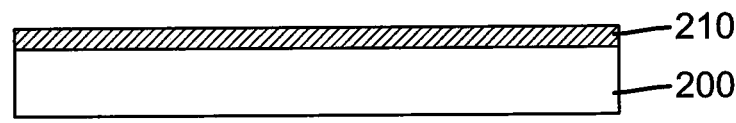
Figure 12C:
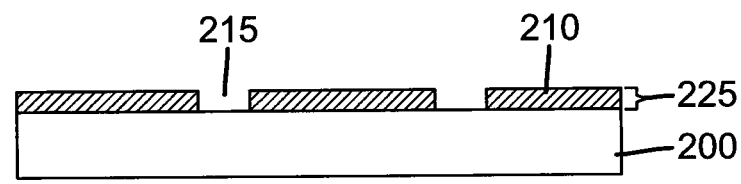
Figure 12D:
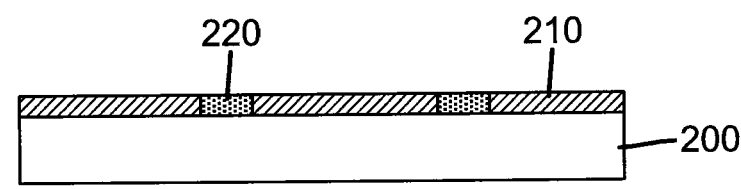
Figure 12E:
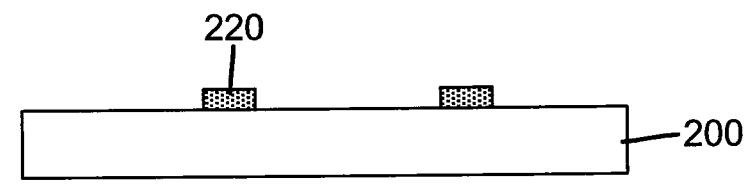

It is the goal of the present invention to provide a patterned thin film that is not only deposited via an ALD or CVD process, but simultaneously patterned using selective area deposition (SAD) materials and processes. As described above, SAD processes use a deposition inhibitor material in order to inhibit the ALD growth of the thin film in the non-selected areas. This process can be better understood with reference to FIGS. 12A through 12E. FIG. 12A shows substrate 200 prior to the application of the deposition inhibitor material 210. Although the substrate 200 is illustrated as a bare substrate, one skilled in the art should recognize that substrate 200 can contain layers of materials, either patterned or unpatterned, to serve any purpose electrical, optical, or mechanical, as desired. FIG. 12B shows substrate 200 after a uniform deposition of deposition inhibitor material 210. FIG. 12C illustrates substrate 200 after the step of patterning the deposition inhibitor material 210 into deposition mask 225. The patterning can be done by any method known in the art, including photolithography using either positive or negative acting photoresists, laser ablation, or other subtractive processes. It is particularly useful to use a laser transfer method as described herein. As shown, deposition mask 225 contains areas of deposition inhibitor material 210 and areas of substrate for deposition 215. FIG. 12D illustrates substrate 200 after the step of atomic layer deposition of the desired thin film material. As shown, thin film material 220 is only deposited on the substrate 200 where there was no deposition inhibitor material 210. The thin film material 220 does not form any appreciable thin film over deposition inhibitor material 210. FIG. 12E illustrates a patterned thin film material 220 after removing the deposition inhibitor material 210. It would be understood by one skilled in the art, that in some instances it would not be necessary to remove the deposition inhibitor material 210.

Figure 13A:
FIGS. 13A through 13D show the layers on the substrate at different points in another embodiment of the present invention.
Figure 13B:
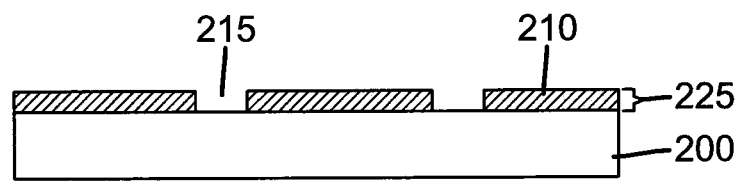
Figure 13C:
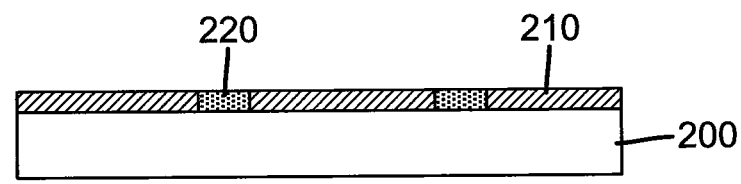
Figure 13D:
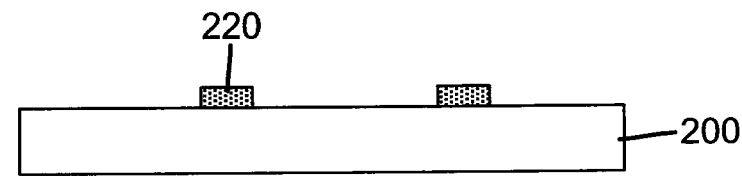

FIGS. 13A, 13C, and 13D should be understood with respect to the descriptions of FIGS. 12A, 12D, and 12E respectively. FIG. 13B illustrates a deposition mask 225 formed by patterned deposition of the deposition inhibitor material 210. Patterned deposition can be done using any additive printing method including, but not limited to inkjet, gravure, flexography, patch coating, screen printing, donor transfer, microcontact printing, or offset lithography.

The present invention provides at least the following embodiments and combinations thereof, but other combinations of features are considered to be within the present invention as a skilled artisan would appreciate from the teaching of this disclosure:

1. A deposition method for forming a patterned thin film comprising:

applying a composition comprising a deposition inhibitor material to a receiver substrate, simultaneously or subsequently to the applying step, patterning the deposition inhibitor material to provide selected areas on the receiver substrate where the deposition inhibitor material is absent, and depositing an inorganic thin film on the receiver substrate by chemical vapor deposition only in those areas where the deposition inhibitor material is absent, wherein the deposition inhibitor material is a polymer comprising recurring units represented by the following Structure (I):

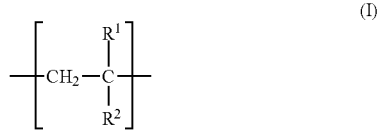

wherein $R^1$ is hydrogen, an alkyl group, or a group as defined for $R^2$, and $R^2$ is a cyano, isocyanate, azide, sulfonyl, nitro, phosphoric, phosphonyl, heteroaryl, or —C(=X)—$R^3$ wherein X is oxygen, sulfur, or $N^+(R)_2$, $R^3$ is R, OR, OM$^+$, OC(=O)OR, SR, NHC(=O)R, NHC(=O)N(R)$_2$, N(R)$_2$, or $N^+(R)_3$, $M^+$ is an alkali or ammonium cation, and R is hydrogen, a halogen, or an alkyl or cycloalkyl group.

2. The deposition method of embodiment 1 wherein the deposition inhibitor material is a cyanoacrylate polymer comprising recurring units that are represented by Structure (I) wherein R is hydrogen or an alkyl or cyano group, and at least one of $R^1$ and $R^2$ is a cyano group.

3. The deposition method of embodiment 1 or 2 wherein the deposition inhibitor material is a cyanoacrylate polymer comprising recurring units that are represented by Structure (I) wherein $R^1$ is hydrogen or an alkyl group having 1 to 8 carbon atoms, and $R^2$ is a cyano group.

4. The deposition method of any of embodiments 1 to 3 wherein the deposition inhibitor material is a cyanoacrylate polymer that comprises at least two different recurring units that are represented by Structure (I).

5. The deposition method of any of embodiments 1 to 4 wherein the deposition inhibitor material is a cyanoacrylate polymer that comprises the same or different recurring units that are represented by Structure (I) in an amount of at least 1 mol % and up to 100 mol % based on total polymer recurring units.

6. The deposition method of any of embodiments 1 wherein the deposition inhibitor material is a cyanoacrylate polymer that comprises the same or different recurring units represented by Structure (I) in an amount of at least 1 weight % and up to and including 100 weight %.

7. The deposition method of any of embodiments 1 to 6 comprising depositing the inorganic thin film on the receiver substrate by atomic layer deposition.

8. The deposition method of any of embodiments 1 to 7 comprising patterning the composition comprising the deposition inhibitor material on the receiver substrate by thermal transfer from a donor element comprising a thermal transfer layer comprising the composition comprising the deposition inhibitor material.

9. The deposition method of embodiment 7 comprising patterning the composition comprising the deposition inhibitor material on the receiver substrate by thermal transfer from a donor element during which the donor element and the receiver substrate are in direct contact or separated by up to and including 50 µm.

10. The deposition method of embodiment 8 comprising patterning the composition comprising the deposition inhibitor material on the receiver substrate by thermal transfer from a donor element using focused laser energy.

11. The deposition method of embodiment 8 comprising patterning the composition comprising the deposition inhibitor material on the receiver substrate by thermal transfer from a donor element that comprises a radiation absorber.

12. The deposition method of embodiment 8 comprising patterning the deposition inhibitor material by thermal transfer on the receiver substrate from a donor element that comprises a radiation absorber in an intermediate layer between a thermal transfer layer comprising the deposition inhibitor material and donor substrate in the donor element.

13. The deposition method of embodiment 12 comprising patterning the deposition inhibitor material by thermal transfer on the receiver substrate from a donor element that comprises an infrared radiation absorber in a thermal transfer layer comprising the deposition inhibitor material.

14. The deposition method of any of embodiments 1 to 13 comprising coating the composition comprising the deposition inhibitor material on the receiver substrate, followed by patterning the coated deposition inhibitor material by thermal ablation.

15. The deposition method of any of embodiments 1 to 14 comprising coating the composition comprising the deposition inhibitor material on the substrate, followed by patterning the coated deposition inhibitor material by thermal ablation using a focused laser.

16. The deposition method of any of embodiments 1 to 15 wherein the deposited inorganic thin film has an inhibition of at least 200 Å.

17. The deposition method of any of embodiments 1 to 16 wherein the deposited inorganic thin film is either a metal or a metal containing compound.

18. The deposition method of any of embodiments 1 to 17 wherein the thin film is deposited using spatially dependant ALD that comprises:

providing a series of gas channels, each in contact with a discrete separate region of a receiver substrate, and each gas channel having a gas composition, the gas composition comprising, in order, at least a first reactive gaseous material, an inert purge gas, and a second reactive gaseous material, and optionally repeating this sequence one or more times, and moving the receiver substrate relative to the gas channels so that a portion of the receiver substrate comes into contact sequentially with at least two gas zones, wherein the first reactive gaseous material is capable of reacting with the receiver substrate surface that has been treated with the second reactive gaseous material to form the inorganic thin film.

19. The method of embodiment 18 wherein the receiver substrate comprises a moving web.

18. An electronic device prepared using the method of any of embodiments 1 to 17, which electronic device comprises a receiver substrate and a deposited pattern of the cyanoacrylate polymer comprising recurring units represented by Structure (I).

The following Examples are provided to illustrate the practice of this invention and are not meant to be limiting in any manner.

Measurement of Inhibition Power:

When a substrate surface containing no deposition inhibitor was subjected to ALD deposition, film growth occurred immediately upon commencement of the ALD exposure cycles. Alternatively, when a deposition inhibitor was present on a surface, initial application of ALD exposure cycles led to no film growth. However, most deposition inhibitors do not inhibit perfectly. Thus, after continued application of ALD exposure cycles, there will be an onset of film growth on surfaces containing a deposition inhibitor. As described above, the inhibition power of a selective area inhibitor is defined as the amount of film growth that would have occurred in the absence of deposition inhibitor prior to the onset of growth on a substrate that is coated with a deposition inhibitor. A higher inhibition power indicates a more effective deposition inhibitor.

In a typical process step employing a patterned selective area inhibitor, it is desired to grow a certain film thickness in the areas not containing deposition inhibitor. At the same time, it is desired that little or no deposition occur in regions containing the deposition inhibitor. Thus, the inhibition power can then be thought of as the maximum amount of film growth allowable when using a particular deposition inhibitor to pattern deposition.

To measure the inhibition, a glass substrate was spin coated with a deposition inhibitor solution and then baked in air to ensure complete removal of solvent. The same solution can be coated and baked on a bare silicon wafer in order to test that sample for film thickness using ellipsometry. The glass substrate for the inhibition test was then subjected to ALD growth using a gas bearing ALD coating head as described in U.S. Patent Application Publication 2009/0130858 (Levy) that is incorporated herein by reference. The coating head contained regions for a metal precursor, oxygen precursor, and inert purge or separator gases.

To test deposition inhibitors, zinc oxide film growth at 150° C. or 200° C. was used depending on the decomposition temperature of the inhibitor. This deposition employed diethyl zinc (DEZ) as the zinc precursor and water as the oxygen precursor. During this deposition, the partial pressure of DEZ in the metal channels was 100 mtorr, while the partial pressure of water in the oxygen source channels was 50 mtorr. The inert gas and the carrier gases were nitrogen. The substrate speed yielded a channel residence time (thus ALD exposure time) of 63 msec (the same for all precursor and inert streams). At these conditions, an uninhibited substrate will experience a film growth of about 1.63 Å/cycle.

Film thickness of the resulting ZnO layers on top of the deposition inhibitor was determined by ellipsometry. The absorption was then converted to thickness by a calibration. Samples containing a deposition inhibitor were subjected to ALD deposition for 50 cycles at a time and then characterized for thickness on the inhibitor. Once the onset of growth occurred, the number of cycles required to produce a film thickness of 100 Å on the deposition inhibitor surface was interpolated from the data. The thickness of a control containing no deposition inhibitor was then calculated for the same number of cycles using the above growth per cycle. The inhibition power of the deposition inhibitor was therefore the calculated growth that would have occurred on an uninhibited substrate minus the 100 Å allowance for film that had already grown on the deposition inhibitor.

In any test, the maximum number of ALD cycles tested was 1200, yielding a ZnO film on an uninhibited surface of approximately 2000 Å. Thus, samples that showed no growth at this time have a minimum inhibition power of 2000 Å.

Inhibition Evaluations:

A demonstration of the inhibition power of a representative cyanoacrylate polymer was prepared as follows: A 2.5 inch (6.35 cm) by 2.5 inch (6.35 cm) square Si wafer with native oxide surface was spin coated with a 7.5 weight % solution of poly(ethyl cyanoacrylate-co-methyl cyanoacrylate) in a mixed solvent, 1:1 acetonitrile and cyclopentanone, at 3,000 revolutions per minute. The coating was removed from one half of the substrate by immersion in acetone followed by immersion in isopropyl alcohol, and dried with nitrogen. The coated substrate was further dried at 150° C. for 1 minute then subjected to 1200 atomic layer deposition cycles of diethylzinc and water at a substrate temperature of 150° C. Deposited layer thickness was measured by ellipsometry using a fitting routine that included native oxide and a Cauchi model. Deposition on the bare Si oxide surface exhibited 2039 Å±14 Å of ZnO, while the coated side had a combined polymer and ZnO thickness of only 136 Å.

Good discrimination between inhibited and uninhibited areas was observed corresponding to an inhibition power of at least 1903 Å. The sample was then immersed in acetone and rinsed in isopropyl alcohol, dried with nitrogen, and measured again. After washing, the same 2037 Å±14 Å of ZnO on the bare SiO side was observed but only 3 Å remained on the inhibited side. Thus, if any ZnO was deposited on the cyanoacrylate polymer inhibitor, it was not well adhered to the underlying substrate and was easily removed with the inhibitor upon washing providing excellent patterning discrimination.

A second representative sample was prepared by spin coating a 7.5 weight % poly(methyl cyanoacrylate) solution in 1:1 acetonitrile and cyclopentanone at 3,000 rpm on a 2.5 inch (6.35 cm) by 2.5 inch (6.35 cm) square native oxide Si wafer. Half the coating was removed as described above and the sample was subjected to 1200 atomic layer deposition cycles of diethylzinc and water at a substrate temperature of 150° C. On the native oxide side, 2000 Å±14 Å of ZnO was measured while the coated side exhibited 332.4±0.6 Å, giving 1668 Å of inhibition power. After cleaning with acetone, rinsing with IPA, and nitrogen drying, the native oxide side was unchanged (1998 Å±14 Å of ZnO), while the coated side exhibited 3.6±0.1 Å, again illustrating excellent pattern discrimination.

Invention Example 1

Thermal Transfer Patterning

To demonstrate laser thermal patterning using cyanoacrylate polymer inhibitors, a donor element was prepared in the following manner:

A 2.5 inch (6.35 cm) by 2.5 inch (6.35 cm) clean glass substrate was coated with 700 Å of chromium by thermal evaporation to form a light absorbing layer. An array of stand-off spacers was created by spin coating a solution of Novolac resin, crystal violet, and an infrared radiation dye (IR Dye 1) onto the chromium surface and baking the resulting thermal resist at 230° C. for 7 minutes. The thermal resist was exposed with a computer-controlled laser imager having an array of 256 individually addressable 830 nm spots, each about 2.5 μm, focused on the image surface and scanned in swaths about 0.6 mm wide at a rate of 0.4 m/sec. The resulting pattern was an array of unexposed rectangles surrounded by areas having been exposed to 0.6 g/cm$^2$. The exposed element was then developed using Goldstar Plus lithographic developer (Eastman Kodak Company) for 1 minute, rinsed in deionized water, and dried with nitrogen, leaving a series of rectangular pillars approximately 280 µm by 220 µm by 1 µm high on the surface. These pillars were hardened by baking the element at 200° C. for 5 minutes. A 7.5 weight % solution of poly(ethyl cyanoacrylate-co-methyl cyanoacrylate) in 1:1 acetonitrile and cyclopentanone was spin coated at 6,000 rpm over the entire surface to form a donor element.

This donor was placed coated side up on the laser imager platen and a clean glass substrate (receiver element) was place on top of the donor element. Tape was used around the edges to assist the vacuum hold down to keep the donor element and receiver element in registration. This assembly of donor element and receiver element was then exposed with 2.5 J/cm² in the areas surrounding non-exposed 400 µm by 400 µm square patches aligned between the pre-patterned spacers. Thus, the cyanoacrylate polymer inhibitor was transferred from the donor element to the glass receiver element only in the exposed areas, leaving the non-exposed squares on the receiver unaffected. The receiver element was subjected to 176 cycles of diethylzinc and water at a 150° C. substrate temperature. Deposition was observed by reflected light microscopy to occur only in the non-exposed squares.

Invention Example 2

Reusable Donor Element for Thermal Transfer

The ability to reuse a donor element was demonstrated by washing an exposed donor as described in Invention Example 1 in acetone and isopropyl alcohol, drying, and then spinning a new layer of a 7.5 weight % solution of poly(ethylmethyl cyanoacrylate) in 1:1 acetonitrile and cyclopentanone at 6,000 rpm on the substrate surface. It was observed that washing and recoating the substrate left the novolac spacers intact. The coated donor element was again placed coated side up on the laser imager and a clean glass substrate (receiver element) was affixed on top. The assembly of donor element and receiver element was then exposed as before with 2.5 J/cm². The cyanoacrylate polymer inhibitor was transferred to the receiver element only in the exposed areas leaving the non-exposed squares on the receiver element unaffected. The receiver element was then subjected to 176 cycles of diethylzinc and water at 150° C. substrate temperature. Deposition was observed by reflected light microscopy to occur only in the non-exposed squares.

The invention has been described in detail with particular reference to certain preferred embodiments thereof, but it will be understood that variations and modifications can be effected within the spirit and scope of the invention.

PARTS LIST

| | |
|---|---|
| 10 | Delivery head |
| 12 | Output channels |
| 13 | Partitions |
| 14 | Gas inlet conduit |
| 16 | Gas inlet conduit |
| 18 | Gas inlet conduit |
| 20 | Substrate |
| 22 | Exhaust channels |
| 24 | Gas output port |
| 26 | Exhaust port |
| 28a, b, c | Gas supplies |
| 30 | Actuator |
| 32 | Supply lines |
| 36 | Output face |
| 50 | Chamber |
| 52 | Transport motor |
| 54 | Transport subsystem |
| 56 | Logic processor |
| 58 | Optional baffle |
| 60 | Atomic Layer Deposition (ALD) |
| 62 | Web conveyor |
| 66 | Web substrate |
| 70 | Atomic Layer Deposition (ALD) system |
| 74 | Substrate support |
| 96 | Substrate support |
| 200 | Substrate |
| 210 | Deposition inhibitor material |
| 215 | Deposition |
| 220 | Thin film material |
| 225 | Deposition mask |

The invention claimed is:

1. A deposition method for forming a patterned thin film comprising:
applying a composition comprising a deposition inhibitor material to a receiver substrate,
simultaneously or subsequently to the applying step, patterning the deposition inhibitor material to provide selected areas on the receiver substrate where the deposition inhibitor material is absent, and
depositing an inorganic thin film on the receiver substrate by chemical vapor deposition only in those areas where the deposition inhibitor material is absent,
wherein the deposition inhibitor material is a polymer comprising recurring units represented by the following Structure (I):

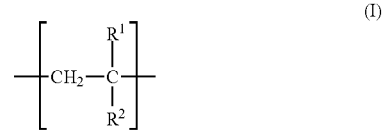

wherein $R^1$ is hydrogen, an alkyl group, or a group as defined for $R^2$, and
$R^2$ is a cyano, isocyanate, azide, chloro, nitro, phosphoric, heteroaryl, or —C(=X)—$R^3$ wherein X is oxygen, sulfur, or $N^+(R)_2$, $R^3$ is R, OR, OM$^+$, OC(=O)OR, SR, NHC(=O)R, NHC(=O)N(R)$_2$, N(R)$_2$, or $N^+(R)_3$, M$^+$ is an alkali or ammonium cation, and R is hydrogen, a halogen, or an alkyl or cycloalkyl group.

2. The deposition method of claim 1 wherein the deposition inhibitor material is a cyanoacrylate polymer comprising recurring units that are represented by Structure (I) wherein R is hydrogen or an alkyl or cyano group, and at least one of $R^1$ and $R^2$ is a cyano group.

3. The deposition method of claim 1 wherein the deposition inhibitor material is a cyanoacrylate polymer comprising recurring units that are represented by Structure (I) wherein $R^1$ is hydrogen or an alkyl group having 1 to 8 carbon atoms, and $R^2$ is a cyano group.

4. The deposition method of claim 1 wherein the deposition inhibitor material is a cyanoacrylate polymer that comprises at least two different recurring units that are represented by Structure (I).

5. The deposition method of claim 1 wherein the deposition inhibitor material is a cyanoacrylate polymer that comprises the same or different recurring units that are represented by Structure (I) in an amount of at least 1 mol % and up to 100 mol % based on total polymer recurring units.

6. The deposition method of claim 1 wherein the deposition inhibitor material is a cyanoacrylate polymer that comprises the same or different recurring units represented by Structure (I) in an amount of at least 1 weight % and up to and including 100 weight %.

7. The deposition method of claim 1 comprising depositing the inorganic thin film on the receiver substrate by atomic layer deposition.

8. The deposition method of claim 1 comprising patterning the composition comprising the deposition inhibitor material on the receiver substrate by thermal transfer from a donor element comprising a thermal transfer layer comprising the composition comprising the deposition inhibitor material.

9. The deposition method of claim 7 comprising patterning the composition comprising the deposition inhibitor material on the receiver substrate by thermal transfer from a donor element during which the donor element and the receiver substrate are in direct contact or separated by up to and including 50 μm.

10. The deposition method of claim 8 comprising patterning the composition comprising the deposition inhibitor material on the receiver substrate by thermal transfer from a donor element using focused laser energy.

11. The deposition method of claim 8 comprising patterning the composition comprising the deposition inhibitor material on the receiver substrate by thermal transfer from a donor element that comprises a radiation absorber.

12. The deposition method of claim 8 comprising patterning the deposition inhibitor material by thermal transfer on the receiver substrate from a donor element that comprises a radiation absorber in an intermediate layer between a thermal transfer layer comprising the deposition inhibitor material and donor substrate in the donor element.

13. The deposition method of claim 12 comprising patterning the deposition inhibitor material by thermal transfer on the receiver substrate from a donor element that comprises an infrared radiation absorber in a thermal transfer layer comprising the deposition inhibitor material.

14. The deposition method of claim 1 comprising coating the composition comprising the deposition inhibitor material on the receiver substrate, followed by patterning the coated deposition inhibitor material by thermal ablation.

15. The deposition method of claim 1 comprising coating the composition comprising the deposition inhibitor material on the substrate, followed by patterning the coated deposition inhibitor material by thermal ablation using a focused laser.

16. The deposition method of claim 1 wherein the deposited inorganic thin film has an inhibition of at least 200 Å.

17. The deposition method of claim 1 wherein the deposited inorganic thin film is either a metal or a metal containing compound.

18. The deposition method of claim 1 wherein the thin film is deposited using spatially dependant ALD that comprises:
   providing a series of gas channels, each in contact with a discrete separate region of a receiver substrate, and each gas channel having a gas composition, the gas composition comprising, in order, at least a first reactive gaseous material, an inert purge gas, and a second reactive gaseous material, and optionally repeating this sequence one or more times, and
   moving the receiver substrate relative to the gas channels so that a portion of the receiver substrate comes into contact sequentially with at least two gas zones,
      wherein the first reactive gaseous material is capable of reacting with the receiver substrate surface that has been treated with the second reactive gaseous material to form the inorganic thin film.

19. The method of claim 18 wherein the receiver substrate comprises a moving web.

20. An electronic device prepared using the method of claim 1, which electronic device comprises a receiver substrate and a deposited pattern of the cyanoacrylate polymer comprising recurring units represented by the Structure (I).

* * * * *